US007022193B2

(12) United States Patent
Jeong et al.

(10) Patent No.: US 7,022,193 B2
(45) Date of Patent: Apr. 4, 2006

(54) APPARATUS AND METHOD FOR TREATING SURFACES OF SEMICONDUCTOR WAFERS USING OZONE

(76) Inventors: In Kwon Jeong, 20425 Via Paviso, #D14, Cupertino, CA (US) 95014; Yong Bae Kim, 1114 Steeplechase La., Cupertino, CA (US) 95014; Jungyup Kim, 350 Elan Village La., #104, San Jose, CA (US) 95134

( * ) Notice: Subject to any disclaimer, the term of this patent is extended or adjusted under 35 U.S.C. 154(b) by 0 days.

(21) Appl. No.: 10/350,739

(22) Filed: Jan. 23, 2003

(65) Prior Publication Data

US 2004/0079396 A1    Apr. 29, 2004

Related U.S. Application Data

(63) Continuation-in-part of application No. 10/282,562, filed on Oct. 29, 2002.

(51) Int. Cl.
   *B08B 3/00*    (2006.01)

(52) U.S. Cl. .............................. 134/30; 134/26; 134/31; 134/34; 134/37; 216/99

(58) Field of Classification Search .................. 134/26, 134/30, 31, 34, 37; 216/62, 74, 79, 99
See application file for complete search history.

(56) References Cited

U.S. PATENT DOCUMENTS

| 5,078,832 | A | * | 1/1992 | Tanaka ........................ 216/94 |
| 5,464,480 | A | | 11/1995 | Matthews |
| 5,749,975 | A | * | 5/1998 | Li et al. ....................... 134/1.3 |
| 5,926,741 | A | * | 7/1999 | Matsuoka et al. .......... 438/778 |
| 5,964,952 | A | * | 10/1999 | Kunze-Concewitz ........... 134/2 |
| 6,240,933 | B1 | * | 6/2001 | Bergman ..................... 134/1.3 |
| 6,290,777 | B1 | | 9/2001 | Imaoka et al. |
| 6,579,382 | B1 | * | 6/2003 | Ito .............................. 134/33 |
| 2001/0031562 | A1 | | 10/2001 | Raaijmakers et al. |
| 2001/0042555 | A1 | | 11/2001 | Bergman et al. |
| 2002/0066464 | A1 | | 6/2002 | Bergman |
| 2002/0108641 | A1 | | 8/2002 | Lee et al. |
| 2002/0157686 | A1 | * | 10/2002 | Kenny et al. ................ 134/1.3 |

* cited by examiner

*Primary Examiner*—M. Kornakov
(74) *Attorney, Agent, or Firm*—Wilson & Ham; Thomas H. Ham

(57) ABSTRACT

An apparatus and method for treating surfaces of semiconductor wafers with a reactive gas, such as ozone, utilizes streams of gaseous material ejected from a gas nozzle structure to create depressions on or holes through a boundary layer of processing fluid formed on a semiconductor wafer surface to increase the amount of reactive gas that reaches the wafer surface through the boundary layer. The apparatus and method may be used to clean a semiconductor wafer surface and/or grow an oxide layer on the wafer surface by oxidation.

57 Claims, 15 Drawing Sheets

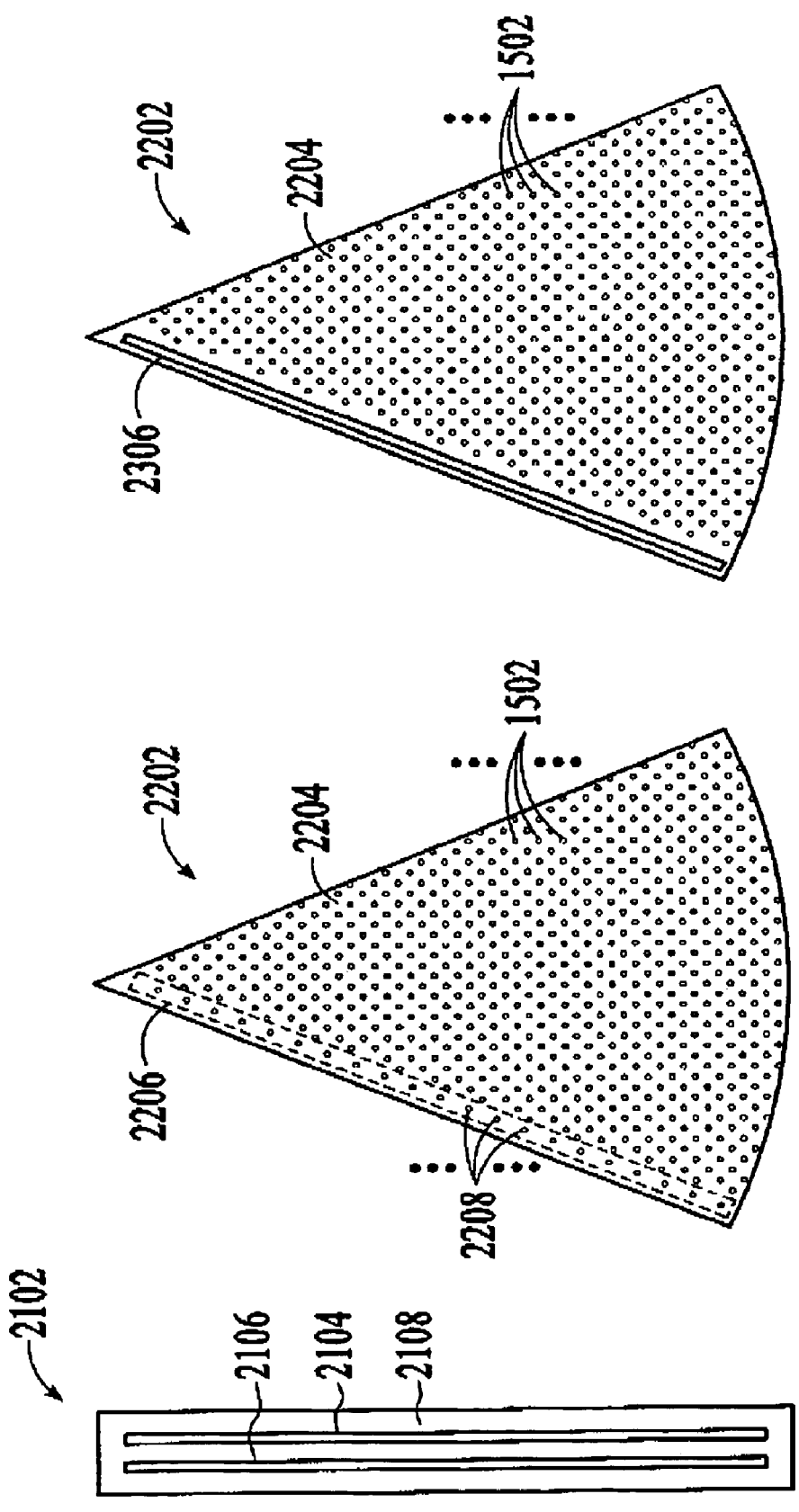

APPARATUS AND METHOD FOR TREATING SURFACES OF SEMICONDUCTOR WAFERS USING OZONE

CROSS REFERENCE TO RELATED APPLICATION

The present application is a continuation-in-part of prior application Ser. No. 10/282,562 filed on Oct. 29, 2002.

FIELD OF THE INVENTION

The invention relates generally to semiconductor fabrication processing, and more particularly to an apparatus and method for treating surfaces of semiconductor wafers using ozone.

BACKGROUND OF THE INVENTION

Recently, the use of ozone has attracted much attention in the semiconductor fabrication industry. Ozone has been found to be effective in cleaning a surface of a semiconductor wafer by oxidizing undesirable organic and/or metallic materials, such as photoresist residue, which can then be removed from the wafer surface. Depending on the cleaning process, a layer of oxide may be formed on the cleaned surface of the semiconductor wafer as a result of the cleaning process. Such a layer of oxide is commonly referred to as a native oxide layer. In addition to cleaning, ozone has been found to be similarly effective in simply growing a layer of oxide on a desired surface of a semiconductor wafer. The grown oxide layers, including native oxide layers, may be used as passivation or interfacial layers for semiconductor devices.

Ozone can be applied to a surface of a semiconductor wafer using a dry or wet technique. Dry ozone application techniques involve exposing a surface of a semiconductor wafer to ozone gas, alone or with one or more gases, to oxidize the materials on the wafer surface. Wet ozone application techniques involve exposing a surface of a semiconductor wafer to both ozone and a processing fluid, such as deionized (DI) water or a chemical solution. Such wet ozone application techniques have been found to be highly effective in promoting oxidization. One wet ozone application technique involves dispensing a processing fluid onto a surface of the semiconductor wafer, which is in a closed processing chamber, and introducing ozone gas into the closed processing chamber. The dispensed processing fluid on the surface of the semiconductor wafer forms a layer of processing fluid on the wafer surface. When the ozone gas is introduced into the closed processing chamber, the ozone gas reaches the surface of the semiconductor wafer by diffusing through the processing fluid layer to oxidize materials on the wafer surface. Another wet ozone application technique involves immersing a semiconductor wafer in a bath of processing fluid with dissolved ozone gas. Thus, the surface of the semiconductor wafer is exposed to both the ozone and the processing fluid. Still another technique involves dispensing a processing fluid with dissolved ozone gas onto a surface of a semiconductor wafer to expose the wafer surface to both the ozone and the processing fluid.

A concern with the above-described wet ozone application techniques is that the rate of oxidation is relatively low due to a number of factors. One factor is that the concentration of ozone in a typical processing fluid is very low. For example, the concentration of ozone in DI water is roughly 2–40 ppm at room temperature. Another factor is that ozone decays in processing fluids, such as DI water and $NH_4OH$ solution. The ozone decay rate depends on the temperature of the processing fluid and the chemicals included in the processing fluid. Consequently, the use of heated processing fluid and/or processing fluid having certain chemicals may not be practical, although such processing fluid may be preferred, due to the high ozone decay rate, which significantly reduces the concentration of ozone applied to the wafer surface.

In view of these concerns, there is a need for an apparatus and method for treating a surface of a semiconductor wafer with both a desired processing fluid and ozone such that a high concentration of ozone can be applied to the wafer surface to effectively oxidize materials on the wafer surface to clean and/or grow an oxide layer on the wafer surface.

SUMMARY OF THE INVENTION

An apparatus and method for treating surfaces of semiconductor wafers with a reactive gas, such as ozone, utilizes streams of gaseous material ejected from a gas nozzle structure to create depressions on or holes through a boundary layer of processing fluid formed on a semiconductor wafer surface to increase the amount of reactive gas that reaches the wafer surface through the boundary layer. The depressions that are created by the streams of gaseous material reduce the thickness of the boundary layer at the depressions, which allows an increased amount of reactive gas to reach the wafer surface through the boundary layer by diffusion. Alternatively, the holes that are created by the streams of gaseous material allow the reactive gas to directly contact the wafer surface through the boundary layer, which results in an increased amount of reactive gas that reaches the wafer surface. The reactive gas can be introduced by including the reactive gas as part of the streams of gaseous material. Alternatively, the reactive gas can be introduced by ejecting the reactive gas as one or more separate streams of reactive gas. As an example, streams of ozone gas can be used so that an increased amount of ozone can reach the semiconductor wafer surface to clean the wafer surface and/or grow an oxide layer on the wafer surface by oxidation.

An apparatus for treating a surface of an object with a reactive gas in accordance with an embodiment of the invention includes an object holding structure, a rotational drive mechanism, a fluid dispensing structure and a gas nozzle structure. The object holding structure is configured to hold the object. The rotational drive mechanism is connected to the object holding structure to rotate the object holding structure and the object. The fluid dispensing structure is positioned relative to the object holding structure to dispense a processing fluid onto the surface of the object, forming a layer of processing fluid on the object surface. The gas nozzle structure is also positioned relative to the object holding structure to eject multiple streams of gaseous material onto the layer of processing fluid formed on the object surface at different locations on the layer of processing fluid. The gas nozzle structure is also configured to introduce a reactive gas to reach and react with the surface of the object.

An apparatus for treating a surface of an object with a reactive gas in accordance with another embodiment of the invention includes an object holding structure, a rotational drive mechanism, a fluid dispensing structure and a gas nozzle structure. The object holding structure is configured to hold the object. The rotational drive mechanism is connected to the object holding structure to rotate the object holding structure and the object. The fluid dispensing structure is positioned relative to the object holding structure to dispense a processing fluid onto the surface of the object, forming a layer of processing fluid on the object surface. The gas nozzle structure includes an elongated gas opening to eject a wall-like stream of gaseous material. The gas nozzle structure is positioned relative to the object holding structure to eject the wall-like stream of gaseous material onto the layer of processing fluid formed on the object surface. The gas nozzle structure is also configured to introduce the reactive gas to reach and react with the surface of the object.

A method for treating a surface of an object with a reactive gas in accordance with an embodiment of the invention includes forming a processing fluid layer on the object surface and ejecting at least one stream of gaseous material through the processing fluid layer onto the wafer surface to expose a portion of the object surface. The method also includes introducing the reactive gas to the exposed portion of the object surface to allow the reactive gas to react with the object surface.

A method for treating a surface of an object with a reactive gas in accordance with another embodiment of the invention includes forming a processing fluid layer on the object surface and ejecting multiple streams of gaseous material onto the processing fluid layer to form multiple depressions on the processing fluid layer. The method also includes introducing the reactive gas to the multiple depressions to allow the reactive gas to reach and react with the object surface.

A method for treating a surface of an object with a reactive gas in accordance with still another embodiment of the invention includes forming a processing fluid layer on the object surface and ejecting a wall-like stream of gaseous material onto the processing fluid layer on the object surface. The method also includes introducing the reactive gas to allow the reactive gas to reach and react with the object surface.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 21 is a bottom view of a bar-type gas nozzle structure, which may be included in the apparatus of FIG. 18.

FIG. 22 is a bottom view of a modified triangular gas nozzle structure in accordance with one configuration, which may be included in the apparatus of FIG. 18.

FIG. 23 is a bottom view of a modified triangular gas nozzle structure in accordance with another configuration, which may be included in the apparatus of FIG. 18.

DETAILED DESCRIPTION

Figure 1:
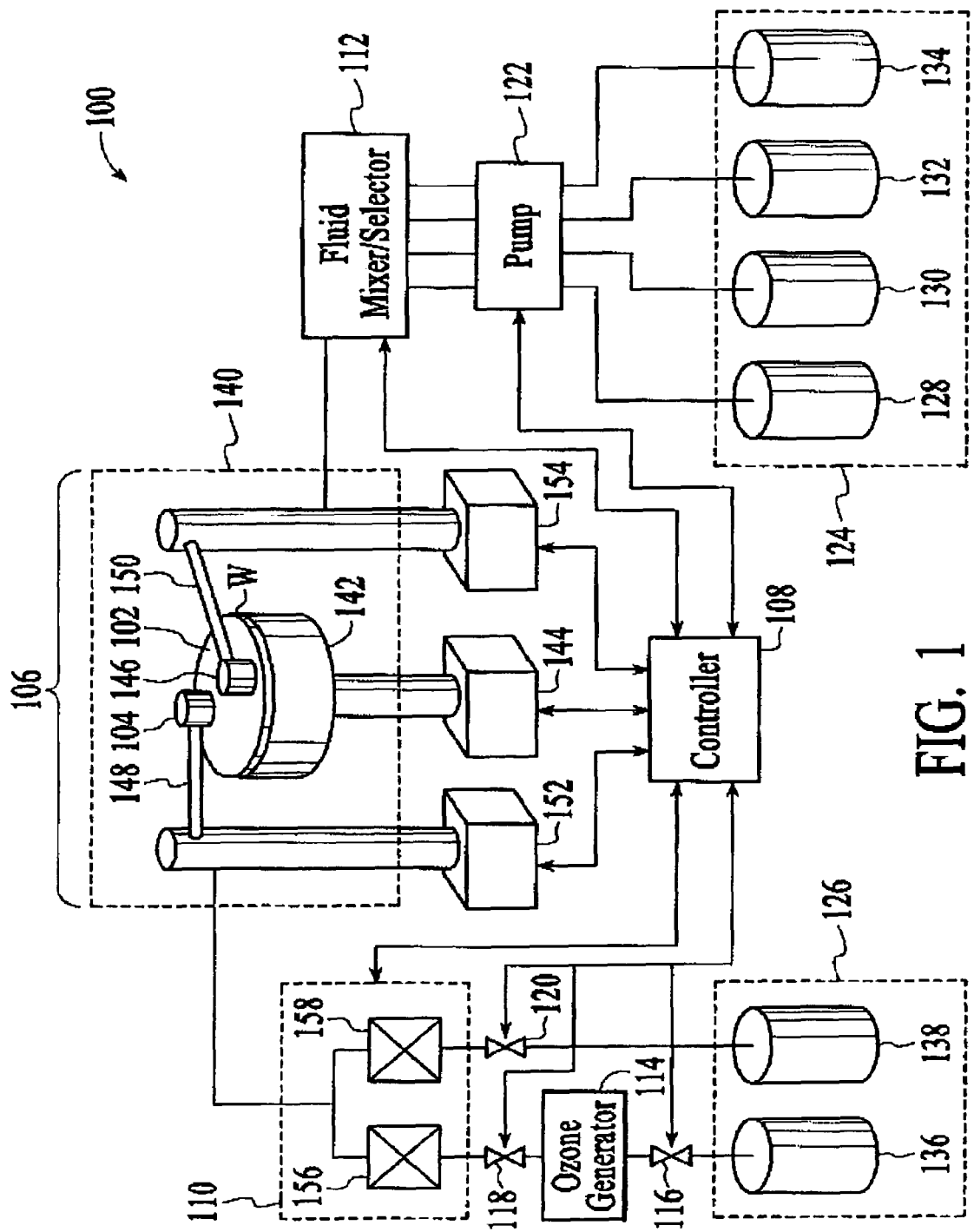
FIG. 1 is a diagram of an apparatus for treating a surface of a semiconductor wafer in accordance with a first embodiment of the present invention.

With reference to FIG. 1, an apparatus 100 for treating a surface 102 of a semiconductor wafer W using a processing fluid in conjunction with a reactive gaseous agent, such as ozone gas, to cause a desired reaction of materials on the wafer surface, such as oxidation, in accordance with a first embodiment of the invention is shown. Thus, the apparatus 100 can be used to remove oxidizable materials on the wafer surface and/or to form an oxide layer on the wafer surface, which may be used as a passivation or interfacial layer for a semiconductor device. The apparatus 100 uses streams of reactive gaseous agent ejected from a gas nozzle structure 104 to increase the amount of reactive gaseous agent to reach the semiconductor wafer surface through a boundary layer of processing fluid formed on the wafer surface. As described in more detail below, the amount of reactive gaseous agent to reach the semiconductor wafer surface is increased either by creating depressions at different locations on the boundary layer to reduce the thickness of the boundary layer at the different locations or by creating holes through the boundary layer to directly contact the wafer surface with the reactive gaseous agent using the pressure of the streams of reactive gaseous agent. The increased amount of reactive gaseous agent to reach the semiconductor wafer surface results in more effective treatment of the wafer surface due to increased reaction with the reactive gaseous agent, which allows the cleaning of the semiconductor wafer surface and/or growing of an oxide layer on the wafer surface to be performed more efficiently.

As shown in FIG. 1, the apparatus 100 includes a single-wafer spin-type processing unit 106, a controller 108, a gas pressure controlling device 110, a fluid mixer/selector 112, an ozone generator 114, valves 116, 118 and 120, a pump 122, a supply of fluids 124, and a supply of gases 126. The fluid supply 124 includes containers 128, 130, 132 and 134 to store different types of fluids, which are used by the single-wafer spin-type processing unit 106, as described below. Although the fluid supply 124 is shown in FIG. 1 to include four containers, the fluid supply may include fewer or more containers. The containers 128, 130, 132 and 134 may include any of the following fluids: de-ionized water, diluted HF, mixture of $NH_4OH$ and $H_2O$, standard clean 1 or "SC1" (mixture of $NH_4OH$, $H_2O_2$ and $H_2O$), standard clean 2 or "SC2" (mixture of HCl, $H_2O_2$ and $H_2O$), ozonated water (de-ionized water with dissolved ozone), known cleaning solvents (e.g., a hydroxyl amine based solvent EKC265, available from EKC technology, Inc.), and any constituent of these fluids. The types of fluids stored in the containers of the fluid supply can vary depending on the particular process to be performed by the apparatus 100.

Similarly, the gas supply 126 includes containers 136 and 138 to store different types of gases, which are also used by the single-wafer spin-type processing unit 106, as described below. Although the gas supply 126 is shown in FIG. 1 to include two containers, the gas supply may include fewer or more containers. The gases stored in the containers may include base gases to generate reactive gaseous agents that react with oxidizable material, such as photoresist residue and silicon-based material, on the semiconductor wafer surface 102 to facilitate cleaning of the wafer surface and/or growing of an oxide layer on the wafer surface. As an example, one of the containers 136 and 138 may store oxygen ($O_2$), which is used by the ozone generator 114 to generate ozone. The generated ozone can then be applied to the semiconductor wafer surface 102 to oxidize materials on the wafer surface, such as residual photoresist. Other gases that may be stored in the containers include gases that are commonly used in conventional single-wafer, spin-type, wet-cleaning apparatuses, such as $N_2$, or any gas that can be used in wafer processing, including HF vaporized gas and isopropyl alcohol (IPA) vaporized gas.

The single-wafer spin-type processing unit 106 includes a processing chamber 140, which provides an enclosed environment for processing a single semiconductor wafer, e.g., the semiconductor wafer W. The processing unit further includes a wafer support structure 142, a motor 144, the gas nozzle structure 104, a fluid dispensing structure 146, mechanical arms 148 and 150, and drive mechanisms 152 and 154. The wafer support structure 142 is configured to securely hold the semiconductor wafer for processing. The wafer support structure 142 is connected to the motor 144, which can be any rotational drive mechanism that provides rotational motion for the wafer support structure. Since the semiconductor wafer is held by the wafer support structure, the rotation of the wafer support structure also rotates the semiconductor wafer. The wafer support structure can be any wafer support structure that can securely hold a semiconductor wafer and rotate the wafer, such as conventional wafer support structures that are currently used in commercially available single-wafer, spin-type, wet-cleaning apparatuses.

Figure 2:
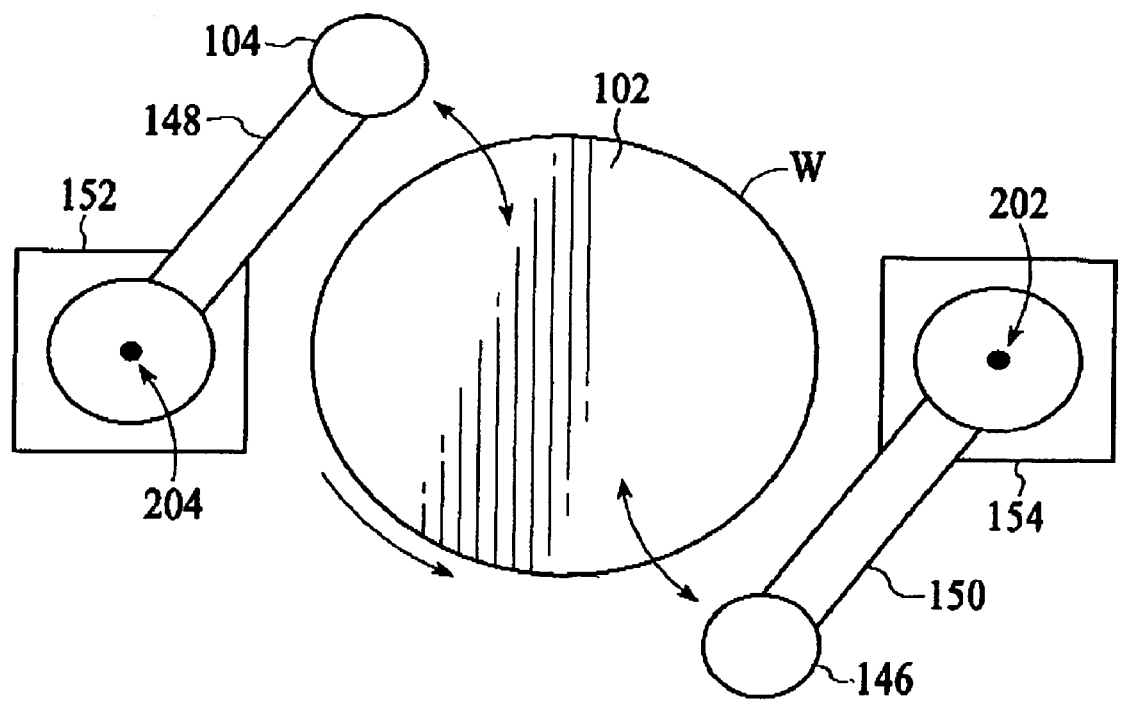
FIG. 2 is a top view of the single-wafer spin-type processing unit of the apparatus of FIG. 1.

The fluid dispensing structure 146 of the single-wafer spin-type processing unit 106 is configured to dispense a processing fluid onto the surface 102 of the semiconductor wafer W, which forms a boundary layer of processing fluid on the wafer surface. This boundary layer is just a layer of fluid formed on the wafer surface by the dispensed processing fluid, such as deionized water. The processing fluid may be one of the fluids stored in the containers 128, 130, 132 and 134 of the fluid supply 124. Alternatively, the processing fluid may be a solution formed by combining two or more of the fluids from the fluid supply. The fluid dispensing structure includes one or more openings (not shown) to dispense the processing fluid onto the semiconductor wafer surface. The fluid dispensing structure is attached to the mechanical arm 150, which is connected to the drive mechanism 154. As illustrated in FIG. 2, which is a top view of the single-wafer spin-type processing unit 106, the drive mechanism 154 is designed to pivot the mechanical arm 150 about an axis 202 to move the fluid dispensing structure 146 laterally or radially across the semiconductor wafer surface. The lateral movement of the fluid dispensing structure allows the processing fluid dispensed from the fluid dispensing structure to be applied to different areas of the semiconductor wafer surface. Preferably, the semiconductor wafer is rotated by the motor 144 as the fluid dispensing structure is laterally moved across the semiconductor wafer surface so that the applied processing fluid can be distributed over the entire wafer surface. The drive mechanism 154 may be further configured to manipulate the mechanical arm 150 so that the fluid dispensing structure can be moved in any number of different possible directions, including the vertical direction to adjust the distance between the fluid dispensing structure and the semiconductor wafer surface.

As shown in FIG. 1, the fluid dispensing structure 146 is connected to the fluid mixer/selector 112 to receive a processing fluid to be applied to the semiconductor wafer surface 102. The fluid mixer/selector operates to provide a processing fluid to the fluid dispensing structure by routing a selected fluid from one of the containers 128, 130, 132 and 134 of the fluid supply 124 or by combining two or more fluids from the containers of the fluid supply to produce the processing fluid, which is then transmitted to the fluid dispensing structure. The fluid mixer/selector is connected to each container of the fluid supply via the pump 122, which operates to pump the fluids from the containers of the fluid supply to the fluid mixer/selector.

Figure 3:
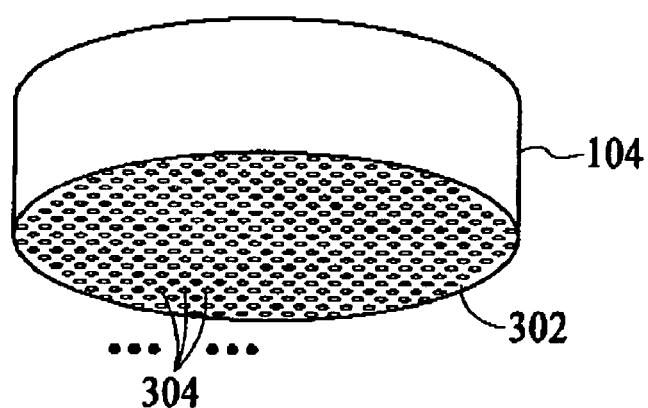
FIG. 3 is a perspective view of the gas nozzle structure of the single-wafer spin-type processing unit of FIG. 2.

The gas nozzle structure 104 of the single-wafer spin-type processing unit 106 is configured to eject streams of gaseous material onto the surface of the semiconductor wafer W. The gaseous material may be a single gas, such as ozone, or a combination of gasses. As illustrated in FIG. 3, which is a perspective view, the exemplary gas nozzle structure has a substantially planer bottom surface 302 with a number of small openings 304 for ejecting the streams of gaseous material. The gas nozzle structure is shown in FIG. 3 as being circular in shape. However, the gas nozzle structure may be configured in other shapes, such as a rectangular shape. The gas nozzle structure may be used during processing of the semiconductor wafer to eject streams of reactive gaseous agent onto the boundary layer of processing fluid formed on the semiconductor wafer surface so that the reactive gaseous agent can react with oxidizable material on the semiconductor wafer surface. In addition, the gas nozzle structure may be used to eject streams of gaseous material, such as IPA vaporized gas, onto the semiconductor wafer surface to dry the wafer surface after the semiconductor wafer has been treated with the processing fluid and ozone and/or rinsed with deionized water.

Similar to the fluid dispensing structure 146, the gas nozzle structure 104 is attached to the mechanical arm 148, which is connected to the drive mechanism 152. The drive mechanism 152 is designed to pivot the mechanical arm 148 about an axis 204 to move the gas nozzle structure laterally or radially across the semiconductor wafer surface 102, as illustrated in FIG. 2. The lateral movement of the gas nozzle structure allows streams of gaseous material ejected from the gas nozzle structure to be applied to different areas of the semiconductor wafer surface. Preferably, the semiconductor wafer is rotated by the motor 144 as the gas nozzle structure is laterally moved across the semiconductor wafer surface so that the streams of gaseous material can be applied over the entire wafer surface. The drive mechanism 152 may be further configured to manipulate the mechanical arm 148 so that the gas nozzle structure can be moved in any number of different possible directions, including the vertical direction to adjust the distance between the openings 304 of the gas nozzle structure and the semiconductor wafer surface.

The gas nozzle structure 104 is connected to the gas pressure controlling device 110, which controls the pressure of the streams of gaseous material ejected from the gas nozzle structure. In the exemplary embodiment, the gas pressure controlling device includes mass flow controllers 156 and 158. The mass flow controller 156 controls the pressure of the ozone supplied by the ozone generator 114, while the mass flow controller 158 controls the pressure of the gas from the container 138 of the gas supply 126. As described in more detail below, the pressure of the streams of gaseous material can be adjusted by the gas pressure controlling device to reduce the thickness of the boundary layer formed on the surface 102 of the semiconductor wafer W at different locations of the boundary layer or to create holes through the boundary layer using the streams of gaseous material. The gas pressure controlling device 110 is connected to the ozone generator 114, which is connected to the container 136 of the gas supply 126. The gas pressure controlling device is also connected to the container 138 of the gas supply. The valves 116, 118 and 120 control the flow of gas between the containers 136 and 138, the ozone generator 114 and the gas pressure controlling device 110.

The controller 108 of the apparatus 100 operates to control various components of the apparatus. The controller controls the motor 144, which rotates the semiconductor wafer W via the wafer support structure 142. The controller also controls the drive mechanisms 152 and 154, which independently move the gas nozzle structure 104 and the fluid dispensing structure 146 by manipulating the mechanical arms 148 and 150. In addition, the controller controls the gas pressure controlling device 110, the fluid mixer/selector 112, the valves 116, 118 and 120, and the pump 122.

Figure 4:
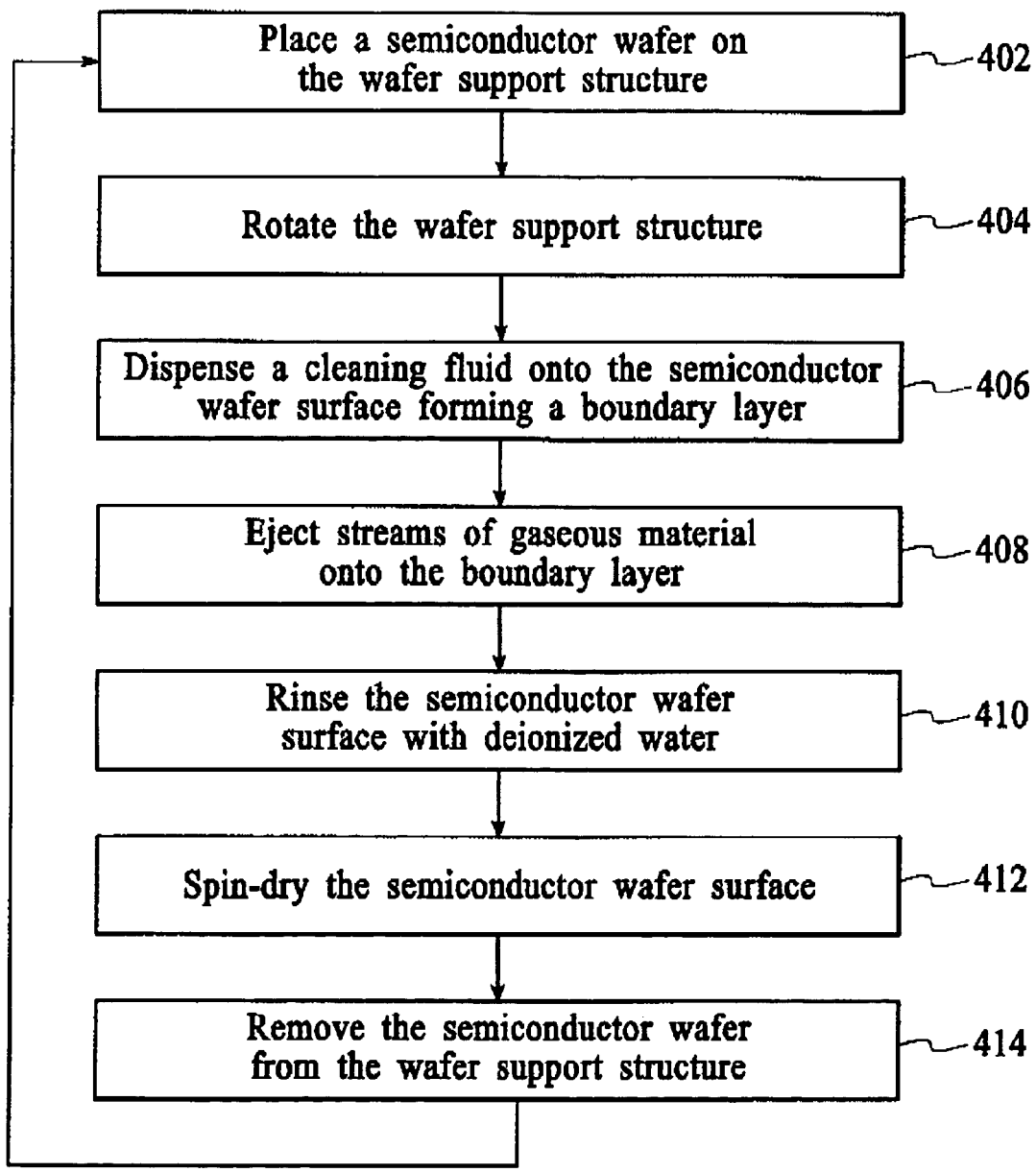
FIG. 4 is a flow diagram of an overall operation of the apparatus of FIG. 1.

The overall operation of the apparatus 100 is described with reference to the flow diagram of FIG. 4. At step 402, a semiconductor wafer to be treated, e.g., the semiconductor wafer W, is placed on the wafer support structure 142 of the single-wafer spin-type processing unit 106. Next, at step 404, the wafer support structure is rotated by the motor 144, spinning the semiconductor wafer. At step 406, a processing fluid is dispensed onto the semiconductor wafer surface 102 from the fluid dispensing structure 146, as the fluid dispensing structure is laterally moved across the wafer surface 102 at a predefined distance from the wafer surface. The dispensed processing fluid forms a boundary layer on the semiconductor wafer surface. The movement of the fluid dispensing structure is controlled by the drive mechanism 154, which manipulates the mechanical arm 150 to move the fluid dispensing structure. Next, at step 408, streams of gaseous material, such as ozone, are ejected from the gas nozzle structure 104 onto the semiconductor wafer surface at a controlled pressure, as the gas nozzle structure is laterally moved across the wafer surface at a predefined distance from the wafer surface. Due to the boundary layer formed on the semiconductor wafer surface, the streams of gaseous material ejected from the gas nozzle structure are applied to the boundary layer. The movement of the gas nozzle structure is controlled by the drive mechanism 152, which manipulates the mechanical arm 148 to move the gas nozzle structure. The pressure of the streams of gaseous material ejected from the gas nozzle structure gas is controlled by the gas pressure controlling device 110.

Figure 5:
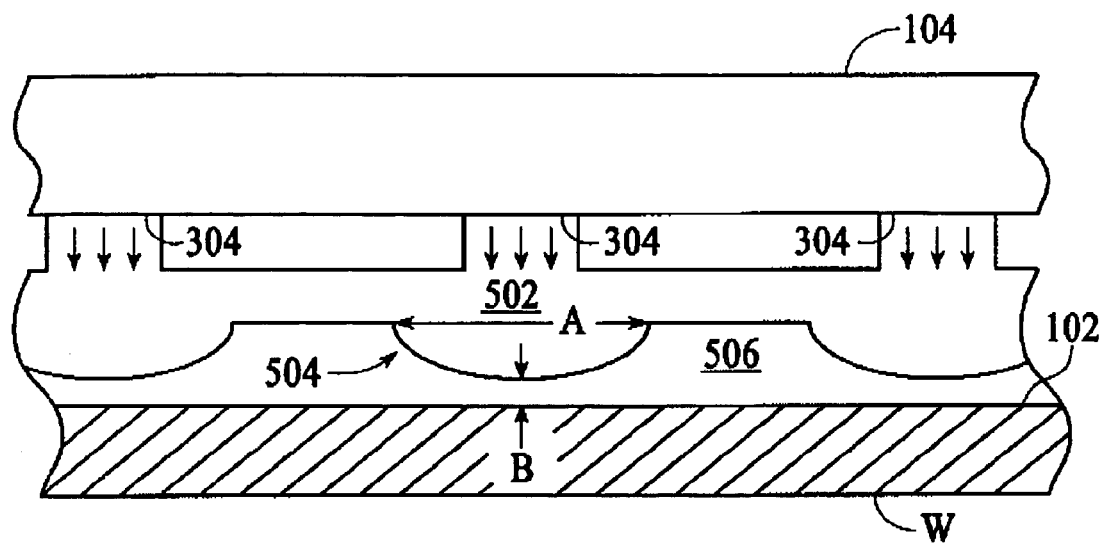
FIG. 5 is an illustration showing depressions that are made on the boundary layer by streams of gaseous material ejected from the gas nozzle structure of the single-wafer spin-type processing unit of FIG. 2.

In one operational mode, the pressure of the ejected streams of gaseous material is adjusted by the gas pressure controlling device 110 so that the streams of gaseous material ejected from the openings 304 of the gas nozzle structure 104 reduce the thickness of the boundary layer formed on the semiconductor wafer surface 102 at different locations of the boundary layer, which may be separated and distinct-locations on the boundary layer. As illustrated in FIG. 5, in this mode, the pressure of the stream of gaseous material 502 ejected from each opening of the gas nozzle structure forms a depression 504 on the boundary layer 506. The characteristics of the depression 504 include the upper diameter A and the distance B between the lower surface of the depression and the semiconductor wafer surface 102, which is the thickness of the boundary layer at the depression. These characteristics are controlled by the pressure of the ejected stream of gaseous material, the diameter of the opening 304, the distance between the opening and the upper surface of the boundary layer 506, and the initial thickness of the boundary layer, which is determined by the wafer rotational speed and the amount (or rate) of the dispensed processing fluid. Where the depressions are formed, the thickness of the boundary layer is reduced, as shown in FIG. 5. Consequently, an increased amount of gaseous material reaches the semiconductor wafer surface through the boundary layer at the depressions by diffusion due to the reduced thickness of the boundary layer at the depressions. If the gaseous material is ozone, the increased amount of ozone to reach the semiconductor wafer surface through diffusion will promote more oxidation, which results in increased cleaning and/or oxide growth efficiency.

Figure 6:
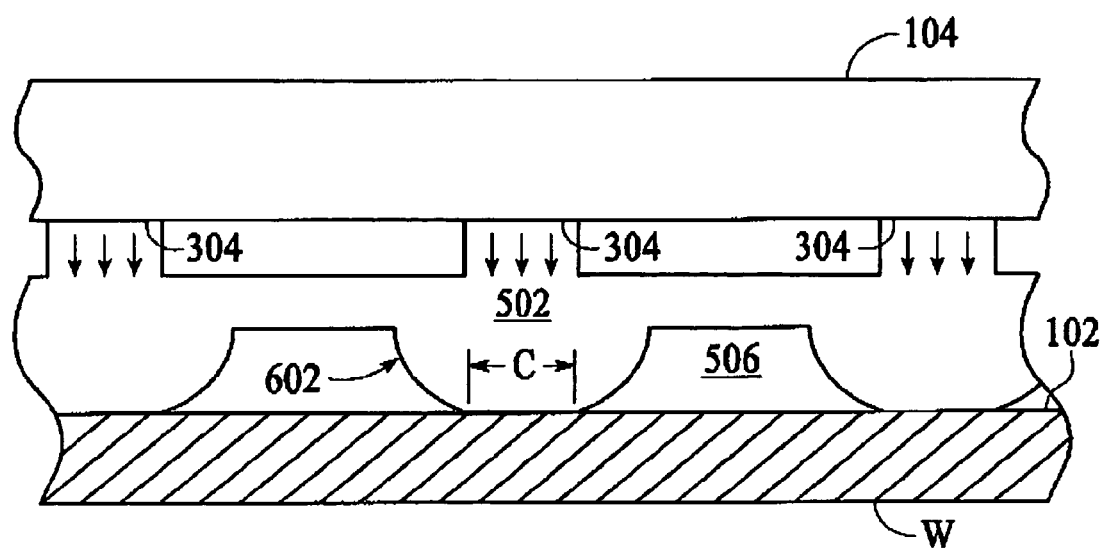
FIG. 6 is an illustration showing holes that are made through the boundary layer by streams of gaseous material ejected from the gas nozzle structure of the single-wafer spin-type processing unit of FIG. 2.

In another operational mode, the pressure of the ejected streams of gaseous material is adjusted by the gas pressure controlling device 110 so that the ejected streams of gaseous material from the openings 304 of the gas nozzle structure 104 can directly contact the semiconductor wafer surface 102. As illustrated in FIG. 6, in this mode, the pressure of the stream of gaseous material 502 from each opening of the gas nozzle structure creates a hole 602 through the boundary layer 506 such that the gaseous material directly contacts the semiconductor wafer surface. A characteristic of the hole 602 is the diameter C of the hole at the semiconductor wafer surface. Similar to the described depression characteristics A and B, the diameter C of the hole 602 is controlled by the pressure of the ejected stream of gaseous material, the diameter of the opening 304, the distance between the opening and the upper surface of the boundary layer 506, and the initial thickness of the boundary layer. The holes can be created by increasing the pressure of the streams of gaseous material from the gas nozzle structure and/or changing other operational parameters of the apparatus 100, such as the distance between the openings 304 of the gas nozzle structure 104 and the boundary layer 506. The streams of gaseous material from the different openings of the gas nozzle structure create an array of exposed regions on the semiconductor wafer surface that are surrounded by the processing fluid, i.e., the boundary layer. Since the semiconductor wafer is typically rotated during processing, the exposed regions of the wafer surface continuously change as the wafer is rotated. Thus, a particular region of the semiconductor wafer surface will only be exposed to a stream of gaseous material gas for a short period of time, allowing the gaseous material to react with reactable materials on the wafer surface in the presence of the processing fluid. It is worth noting that for ozone, a desired oxidizing reaction with oxidizable materials occurs only in the presence of a processing fluid, such as deionized water. Thus, if a large region of the semiconductor wafer surface is exposed to ozone for a long period, then the desired reaction will not take place between the ozone and the oxidizable materials on the semiconductor wafer surface.

Turning back to FIG. 4, the operation proceeds to step 410, at which the semiconductor wafer surface 102 is rinsed with deionized water dispensed from the fluid dispensing structure 146. During this rinse cycle, the gas nozzle structure 104 may be moved away from the semiconductor wafer surface. Next, at step 412, the semiconductor wafer surface is spin-dried by rotating the semiconductor wafer at a high speed. During this spin-dry cycle, the gas nozzle structure 104 may eject streams of gaseous material, such as IPA vaporized gas, to assist in the drying of the semiconductor wafer surface. At step 414, the semiconductor wafer is removed from the wafer support structure 142. The operation then proceeds back to step 402, at which the next semiconductor wafer to be processed is placed on the wafer support structure. Steps 404–414 are then repeated.

Figure 7:
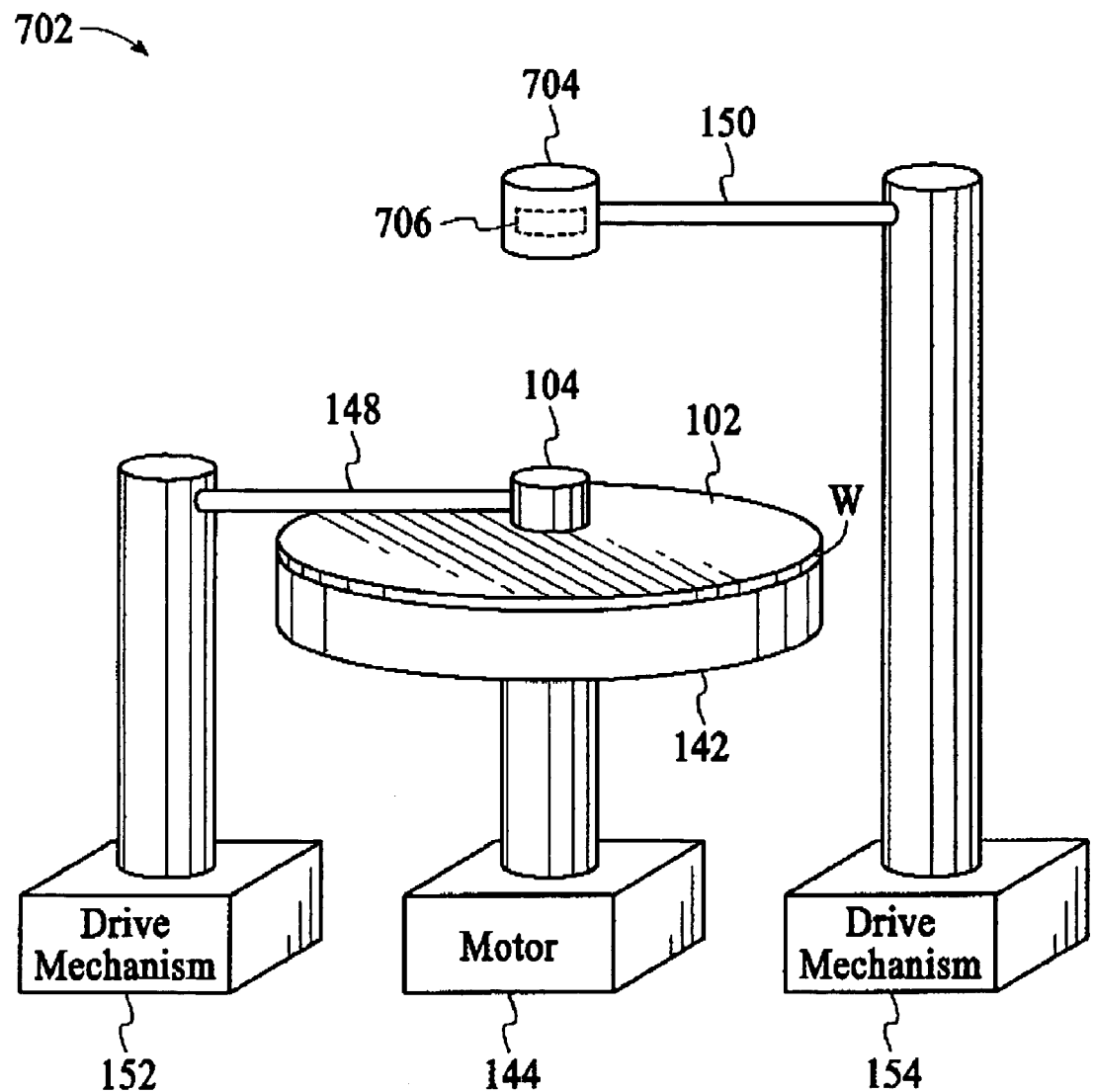
FIG. 7 is a perspective view of a single-wafer spin-type processing unit in accordance with a first alternative embodiment of the invention.

In other embodiments, the single-wafer spin-type processing unit 106 may be modified to dispense the processing fluid over the gas nozzle structure 104 so that the processing fluid and the streams of gaseous material are applied to a common area of the semiconductor wafer surface. In FIG. 7, a single-wafer spin-type processing unit 702 in accordance with a first alternative embodiment is shown. Same reference numerals of FIG. 1 are used to identify similar elements in FIG. 7. In this embodiment, the processing unit 702 includes a fluid dispensing structure 704 that is positioned over the gas nozzle structure 104. As shown in FIG. 7, the fluid dispensing structure 704 may be connected to the drive mechanism 154, and thus, can be moved in various directions. In an alternative configuration, the fluid dispensing structure 704 may be fixed at a predefined location so that the drive mechanism 154 is not needed. The fluid dispensing structure 704 may include one or more small openings to spray a processing fluid onto the semiconductor wafer surface 102 so that the processing fluid is applied over the entire wafer surface in a substantially even manner. The fluid dispensing structure 704 may further include an acoustic transducer 706 to generate a fog of processing fluid using sonic energy, which allows the processing fluid to be applied more evenly over the entire semiconductor wafer surface.

Figure 8:
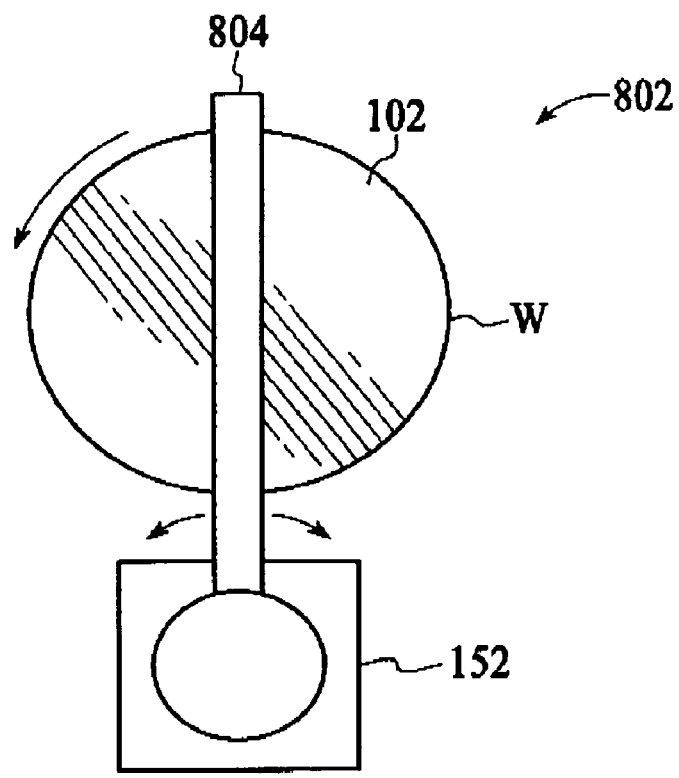
FIG. 8 is a top view of a single-wafer spin-type processing unit in accordance with a second alternative embodiment of the invention.
Figure 9:
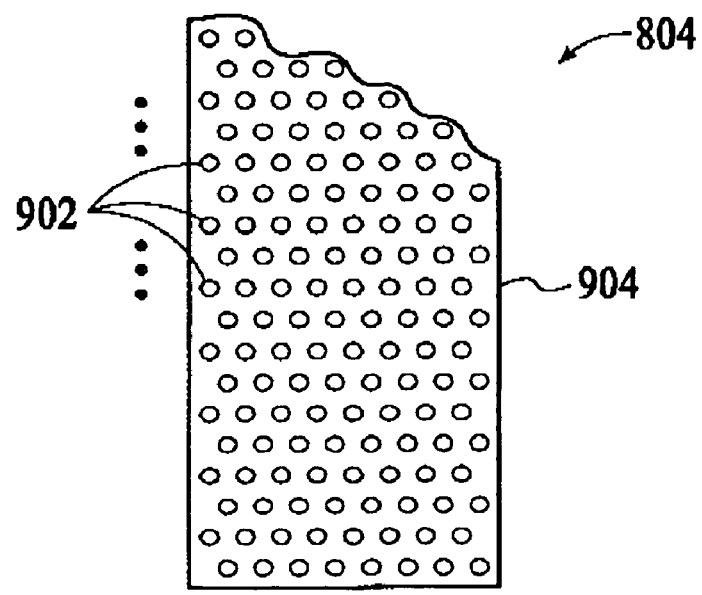
FIG. 9 is a sectional bottom view of the bar-type gas nozzle structure of the single-wafer spin-type processing unit of FIG. 8.

In FIG. 8, a single-wafer spin-type processing unit 802 in accordance with a second alternative embodiment is shown. Same reference numerals of FIGS. 1 and 7 are used to identify similar elements in FIG. 8. The processing unit 802 is similar to the processing unit 702 of FIG. 7. The main difference between the two processing units is that the processing unit 802 includes a bar-type gas nozzle structure 804, which replaces the gas nozzle structure 104 of the processing unit 702. The fluid dispensing structure 702, the mechanical arm 150 and the drive mechanism 154 are not shown in FIG. 8. The shape of the bar-type gas nozzle structure may be any bar-like configuration. As an example, the bar-type gas nozzle structure may be an elongated structure with a rectangular or circular cross-section. In other configurations, the bar-type gas nozzle structure may be curved. The bar-type gas nozzle structure 804 includes openings 902 on the bottom surface 904 of the structure to eject streams of gaseous material, such as ozone, as illustrated in FIG. 9. Consequently, the entire semiconductor wafer surface can be subjected to streams of gaseous material from the bar-type gas nozzle structure by a single pass of the gas nozzle structure across the wafer surface.

Figure 10:
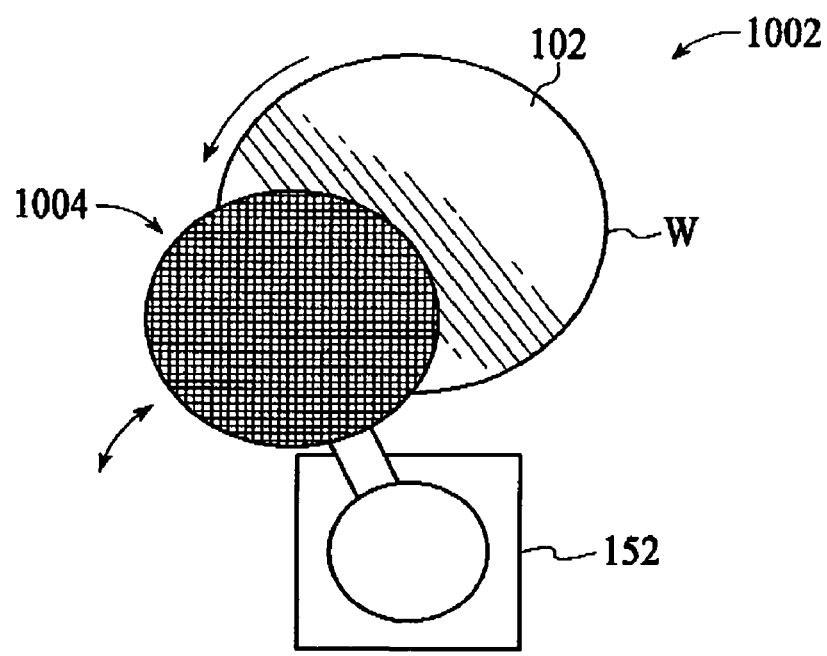
FIG. 10 is a top view of a single-wafer spin-type processing unit in accordance with a third alternative embodiment of the invention.
Figure 11:
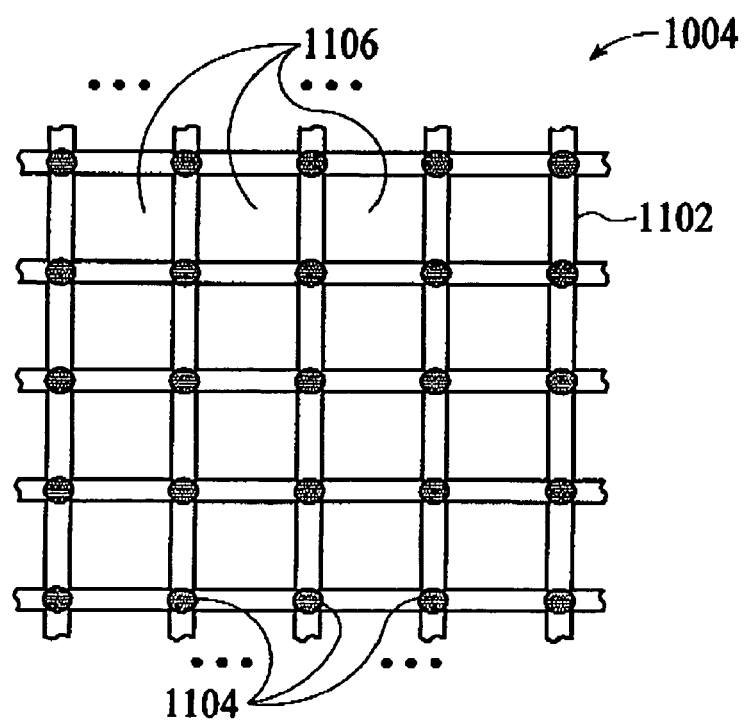
FIG. 11 is a sectional bottom view of the grid-type gas nozzle structure of the single-wafer spin-type processing unit of FIG. 10.

In FIG. 10, a single-wafer spin-type processing unit 1002 in accordance with a third alternative embodiment is shown. Same reference numerals of FIGS. 1, 7 and 8 are used to identify similar elements in FIG. 10. The single-wafer spin-type processing unit 1002 of FIG. 10 is similar to the single-wafer spin-type processing units 702 and 802 of FIGS. 7 and 8. The main difference between the processing unit 1002 and the processing units 702 and 802 is that the processing unit 1002 includes a grid-type gas nozzle structure 1004, rather than the gas nozzle structure 104 or the bar-type gas nozzle structure 804. As illustrated in FIG. 11, which is a bottom view, the grid-type gas nozzle structure 1004 is configured as a grid 1102 with openings 1104 to eject streams of gaseous material, such as ozone. The openings are shown to be located at the intersections of the grid 1102. However, the openings may be located at other places on the grid. Due to the grid configuration, the grid-type gas nozzle structure includes rectangular spaces 1106 that permit the dispensed processing fluid from the fluid dispensing structure 704, which is positioned above the grid-type gas nozzle structure, to pass through the grid-type gas nozzle structure. As stated above, the dispensed processing fluid from the fluid dispensing structure may be in the form of a spray or fog. Consequently, the grid-type gas nozzle structure allows both the processing fluid from the fluid dispensing structure and the streams of gaseous material from the grid-type gas nozzle structure to be applied on a common area of the semiconductor wafer surface 102. Although the grid-type gas nozzle structure has been described and illustrated as being a grid structure, the grid-type nozzle structure may be any grid-like structure with an array of spaces, which may be rectangular, circular or any desired shape. As an example, the grid-type gas nozzle structure may be configured as a circular disk with an array of circular spaces.

The operation of an apparatus employing the single-wafer spin-type processing unit 702, 802 or 1002 is similar to the operation of the apparatus 100 of FIG. 1. A significant difference is that, for the apparatus employing the single-wafer spin-type processing unit 702, 802 or 1002, the processing fluid is dispensed from the fluid dispensing structure 704 above the gas nozzle structure 104, 804 or 1104 in the form of a spray or fog, which allows the processing fluid and the streams of gaseous material from the gas nozzle structure to be applied to a common area of the semiconductor wafer surface.

Figures 12, 13:
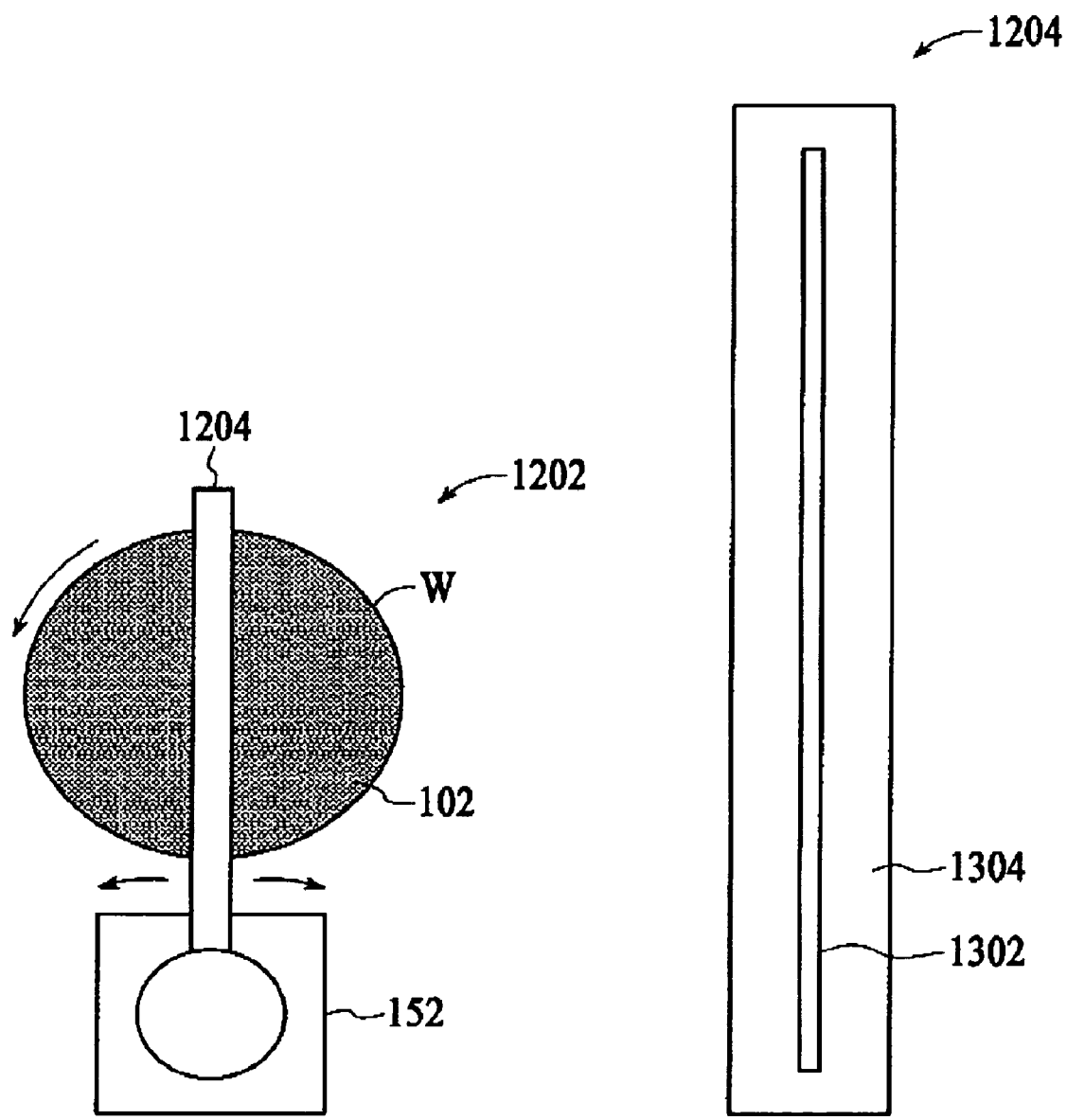
FIG. 12 is a top view of a single-wafer spin-type processing unit in accordance with a fourth alternative embodiment of the invention.
FIG. 13 is a bottom view of the bar-type gas nozzle structure of the single-wafer spin-type processing unit of FIG. 12.

In FIG. 12, a single-wafer spin-type processing unit 1202 in accordance with a fourth alternative embodiment is shown. Same reference numerals of FIGS. 1, 7 and 8 are used to identify similar elements in FIG. 12. The single-wafer spin-type processing unit 1202 of FIG. 12 is similar to the single-wafer spin-type processing unit 802 of FIG. 8 in that the single-wafer spin-type processing unit 1202 also uses a bar-type gas nozzle structure 1204. However, in contrast to the bar-type gas nozzle structure 804 of the single-wafer spin-type processing unit 802, the bar-type gas nozzle structure 1204 includes an elongated gas opening 1302, or a slit, on the bottom surface 1304 of the structure to eject a single wall-like stream of gaseous material, such as ozone, as illustrated in FIG. 13. Although the bar-type gas nozzle structure 1204 is illustrated in FIG. 13 as including only one elongated gas opening, the bar-type gas nozzle structure may include additional elongated gas openings. The bar-type gas nozzle structure 1204 may also include additional small openings, such as the gas openings 902 of the bar-type gas nozzle structure 804, shown in FIG. 9. In one configuration, the single-wafer spin-type processing unit 1202 is configured such that the bar-type gas nozzle structure 1204 can be pivoted across the wafer surface 102, as indicated in FIG. 12. In another configuration, the single-wafer spin-type processing unit 1202 is configured such that the bar-type gas nozzle structure 1204 is stationary with respect to the lateral direction, i.e., the direction parallel to the wafer surface 102. In either configuration, the length of the elongated gas opening 1302 is preferable equal to or greater than the radius of the semiconductor wafer W so that the gaseous material can be applied to the entire surface 102 of the wafer when the wafer is rotated. Although not illustrated, the single-wafer spin-type processing unit 1202 may include either the fluid dispensing structure 146 or 704. Thus, the dispensed processing fluid from the fluid dispensing structure of the single-wafer spin-type processing unit 1202 may be in the form of a spray or fog.

Figure 14:
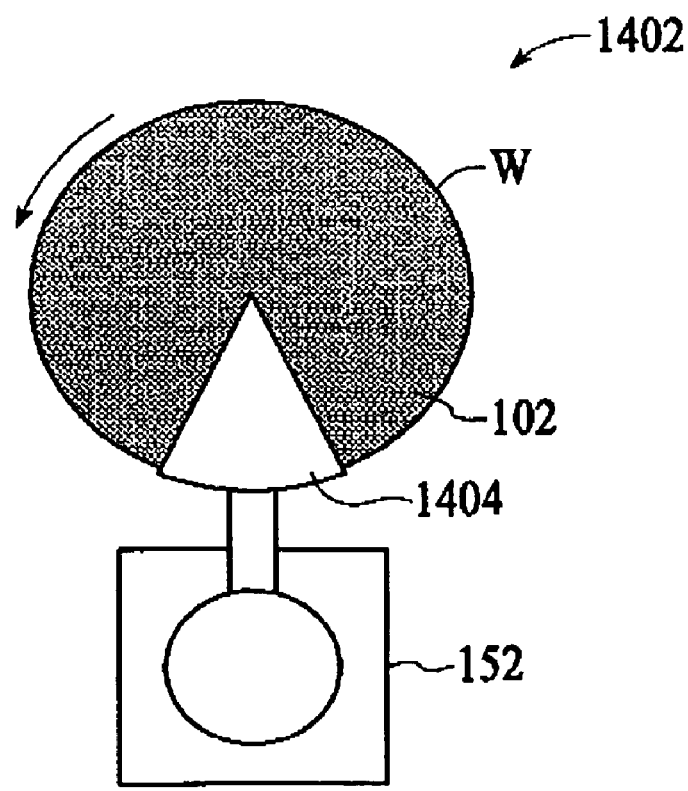
FIG. 14 is a top view of a single-wafer spin-type processing unit in accordance with a fifth alternative embodiment of the invention.
Figure 15:
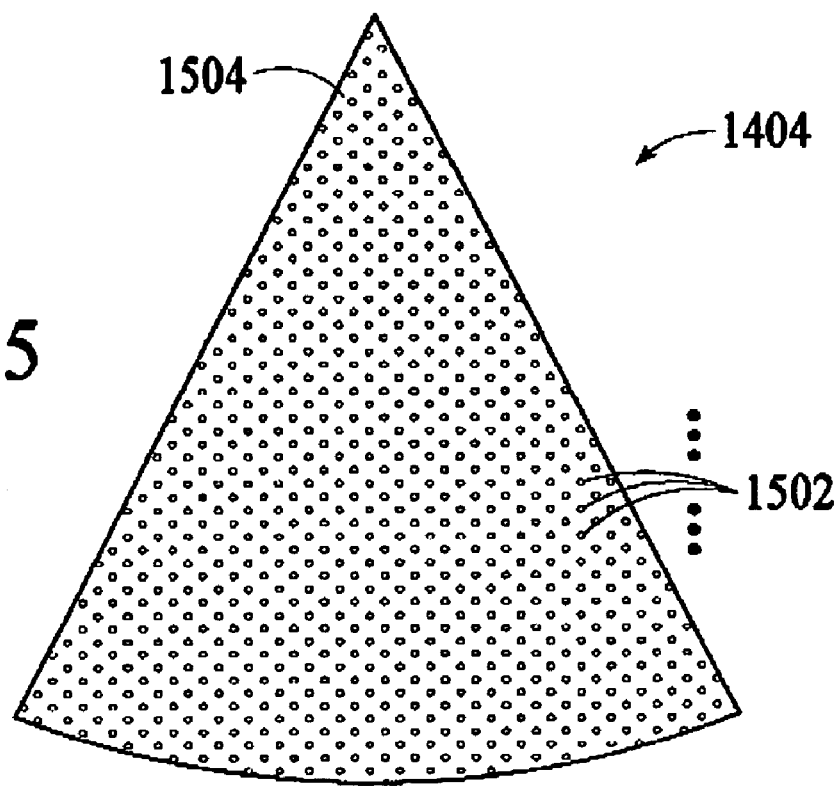
FIG. 15 is a bottom view of the triangular gas nozzle structure of the single-wafer spin-type processing unit of FIG. 14.

In FIG. 14, a single-wafer spin-type processing unit 1402 in accordance with a fifth alternative embodiment is shown. Same reference numerals of FIGS. 1, 7 and 8 are used to identify similar elements in FIG. 14. The single-wafer spin-type processing unit 1402 of FIG. 14 includes a gas nozzle structure 1404, which is triangular in shape. Specifically, the gas nozzle structure 1404 is shaped like a sector of a circle. As illustrated in FIG. 15, the gas nozzle structure 1404 includes gas openings 1502 on the bottom surface 1504 of the structure to eject streams of gaseous material, such as ozone. Due to the triangular shape of the gas nozzle structure 1404, more streams of gaseous material are applied toward the edge of the wafer surface 102 than toward the center of the wafer surface. Thus, as the semiconductor wafer W is rotated, the streams of gaseous material ejected from the gas nozzle structure 1404 are applied to the wafer surface 102 in a substantially equal manner across the wafer surface. In this embodiment, the single-wafer spin-type processing unit 1402 is configured such that the gas nozzle structure 1404 is stationary with respect to the lateral direction. Although not illustrated, the single-wafer spin-type processing unit 1402 may include either the fluid dispensing structure 146 or 704. Thus, the dispensed processing fluid from the fluid dispensing structure of the single-wafer spin-type processing unit 1402 may be in the form of a spray or fog.

Figure 16:
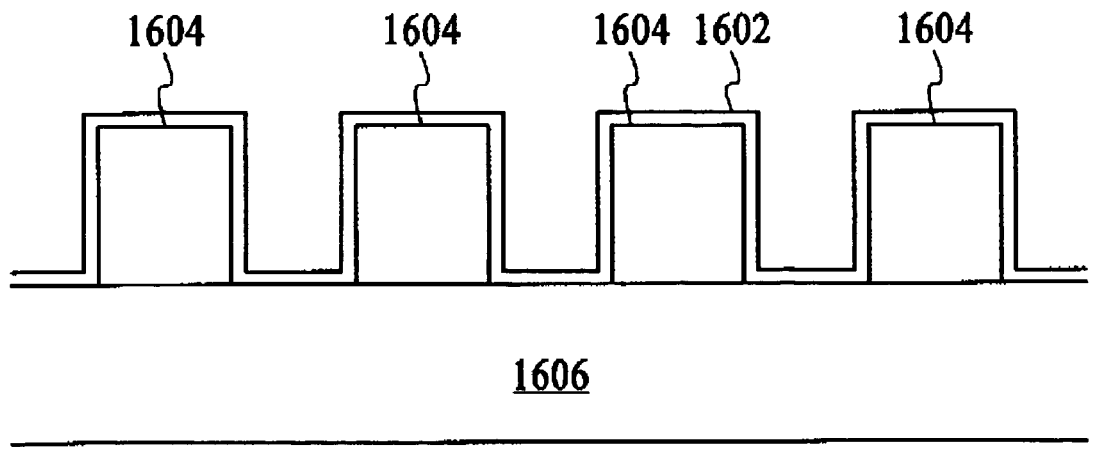
FIG. 16 illustrates a passivation oxide layer formed over patterned structures using an apparatus in accordance with the invention.
Figure 17:
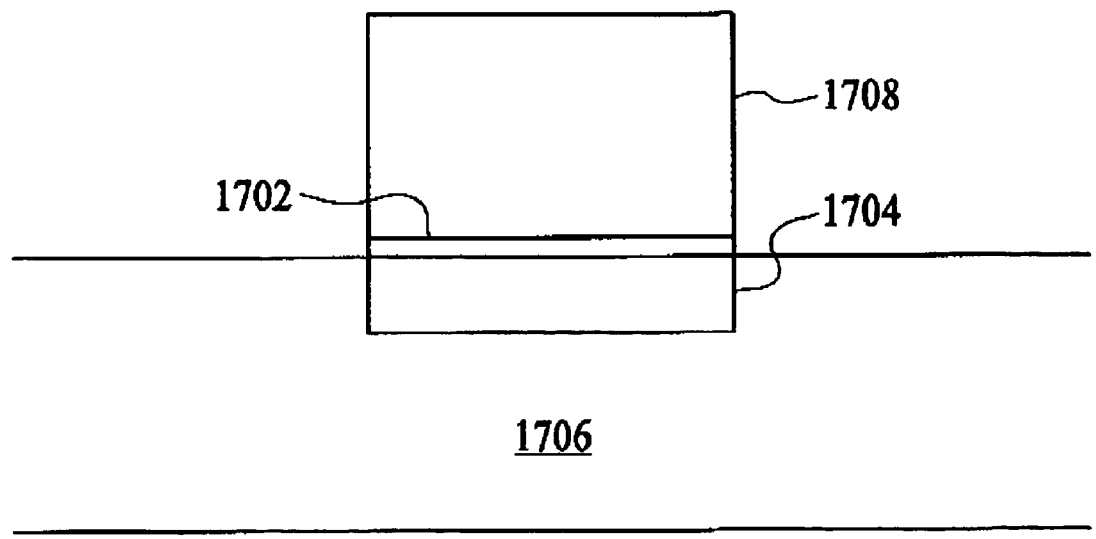
FIG. 17 illustrates an interfacial oxide layer formed between an electrode region and an electrode connector of a transistor using an apparatus in accordance with an invention.

The apparatus 100 employing any of the described single-wafer spin-type processing unit 106, 702, 802, 1002, 1202 or 1402 can be used to clean a semiconductor wafer surface such that undesirable materials on the wafer surface, such as photoresist residue and other contaminants, are removed from the wafer surface by oxidation and by applied forces on the wafer surface due to the dispensed processing fluid and/or the ejected streams of gaseous material. Depending on the cleaning process, which may involve several cleaning steps using different processing fluids, a native oxide layer may or may not be formed on the cleaned wafer surface. The apparatus 100 can also be used to simply grow an oxide layer on a semiconductor wafer surface, which may be a layer of silicon-based material (e.g., SiN), during fabrication of a semiconductor device, such as an integrated circuit. The resulting oxide layer, which can be a native oxide layer, may be used as a passivation layer, an interfacial layer or an oxide layer for any other purpose. As shown in FIG. 16, the apparatus 100 may be used to grow a passivation oxide layer 1602 over patterned structures 1604 formed on a silicon-based substrate 1606, which may be metallic interconnect, so that the patterned structures are protected from the subsequent processing step. As shown in FIG. 17, the apparatus 100 may also be used to grow an interfacial oxide layer 1702 over an electrode region 1704 of a transistor formed on a silicon substrate 1706 such that the interfacial oxide layer is positioned between the electrode region and an electrode connector 1708. The electrode region 1704 and the electrode connector 1708 may be the emitter region and the emitter connector of a bipolar transistor, respectively.

Figure 18:
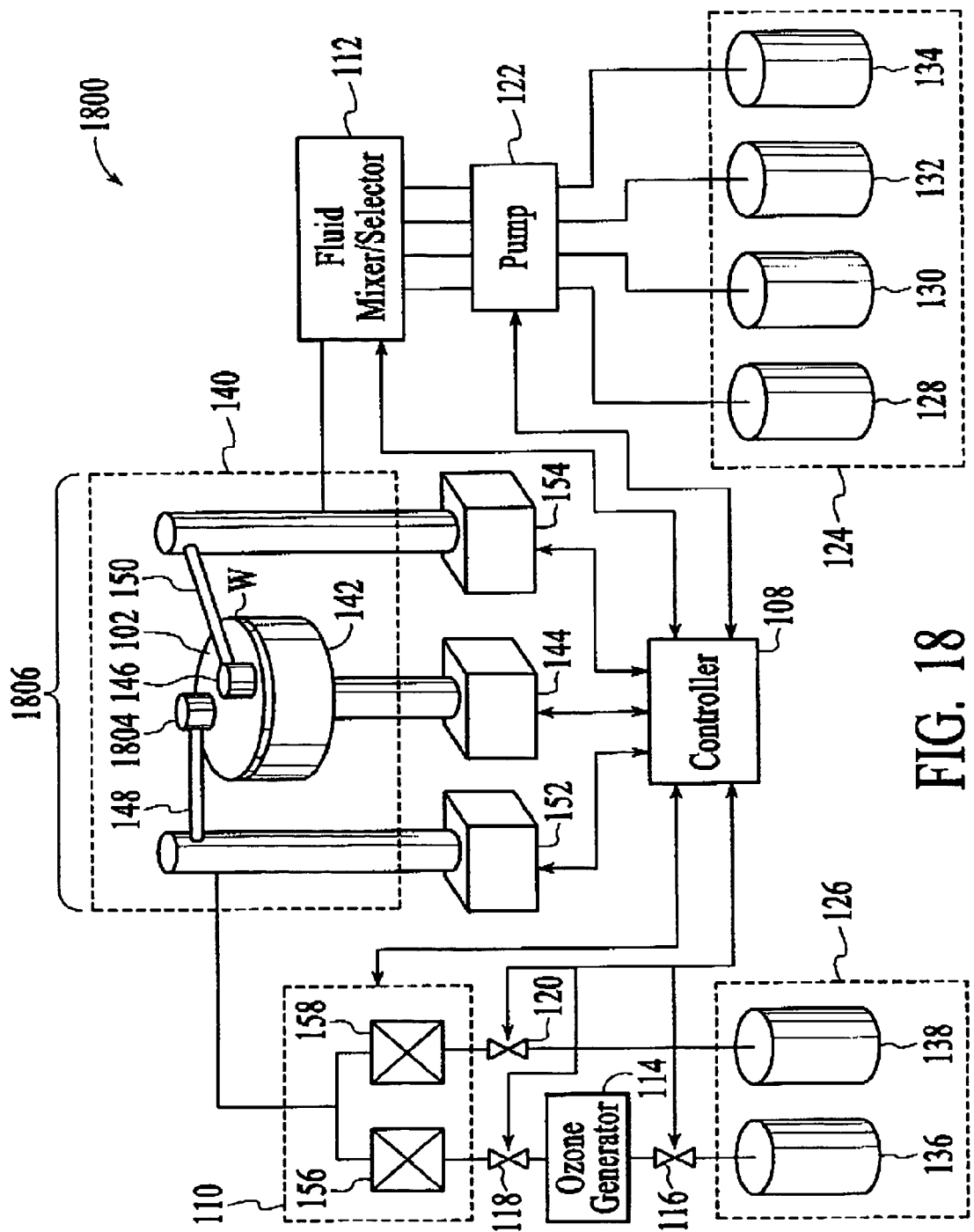
FIG. 18 is a diagram of an apparatus for treating a surface of a semiconductor wafer in accordance with a second embodiment of the present invention.

Turning now to FIG. 18, an apparatus 1800 for treating a surface of a semiconductor wafer, e.g., the semiconductor wafer W, using a processing fluid in conjunction with a reactive gaseous agent, such as ozone, to cause a desired reaction of materials on the wafer surface, such as oxidation, in accordance with a second embodiment of the invention is shown. The same reference numerals of FIG. 1 are used to identify similar elements in FIG. 18. Similar to the apparatus 100 of FIG. 1, the apparatus 1800 can be used to remove oxidizable materials on the wafer surface and/or to form an oxide layer on the wafer surface, which may be used as a passivation or interfacial layer for a semiconductor device. However, in contrast to the apparatus 100, the apparatus 1800 uses streams of inert gas in addition to streams of reactive gas to create depressions on a boundary layer of processing fluid to reduce the thickness of the boundary layer or to create holes through the boundary layer to expose portions of the wafer surface. Preferably, the pressure of the inert gas streams is high enough to create the depressions and holes alone without the assistance of the streams of reactive gas. Consequently, the pressure of the streams of reactive gas can be reduced without significantly affecting the desired reaction with materials on the wafer surface, which means that less reactive gas, such as ozone gas, is needed.

Figure 19:
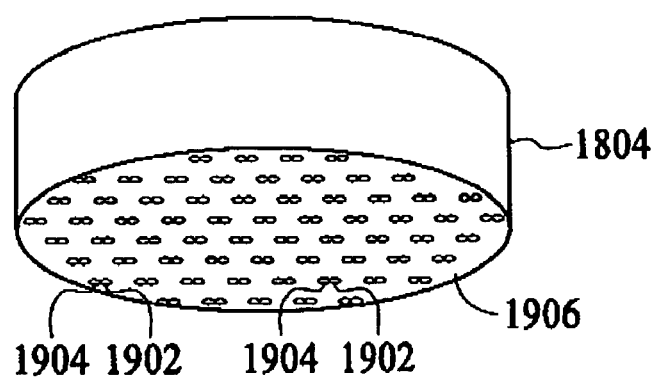
FIG. 19 is a perspective view of a gas nozzle structure, which may be included in the apparatus of FIG. 18.
Figure 20:
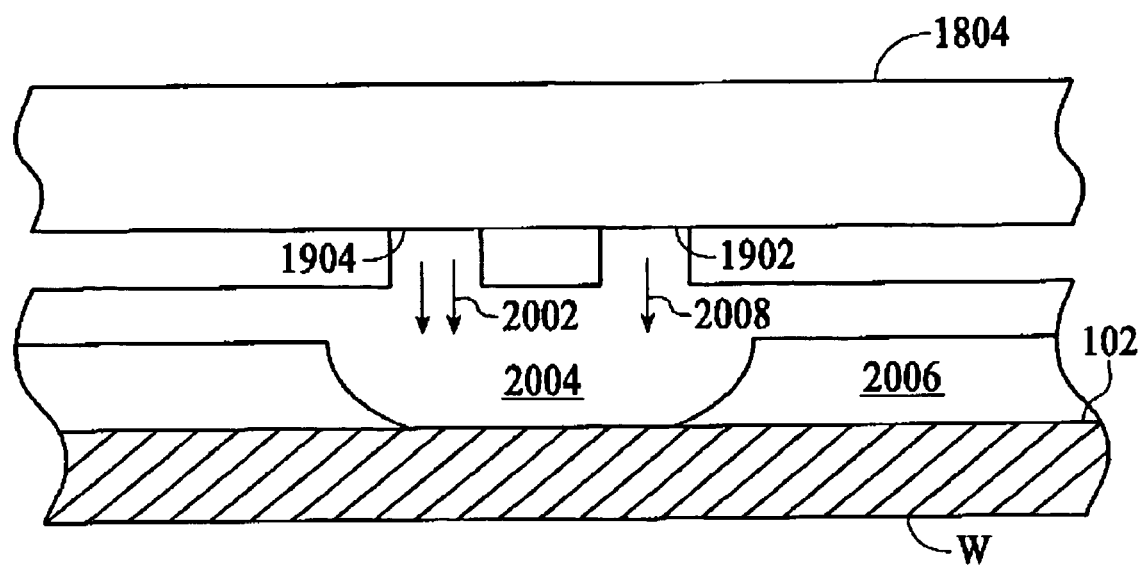
FIG. 20 is an illustration showing a hole that is made through a boundary layer by a stream of inert gas and a stream of reactive gas ejected from the gas nozzle structure of FIG. 19.

The streams of inert gas and the streams of reactive gas are ejected from a gas nozzle structure 1804 of a single-wafer spin-type processing unit 1806, which is connected to the mass flow controllers 156 and 158 to receive the reactive gas and the inert gas. As an example, the reactive gas may be ozone and the inert gas may be $N_2$. The reactive gas may also be a mixture of ozone and $N_2$ or any other gas. Similar to the gas nozzle structure 104 of the apparatus 100, the gas nozzle structure 1804 includes a number of gas openings 1902 and 1904 on the bottom surface 1906 of the structure, as shown in FIG. 19. The gas openings 1902 eject streams of reactive gas, while the gas openings 1904 eject streams of inert gas. The gas openings 1902 and 1904 are positioned on the bottom surface 1906 such that at least one gas opening 1902 is in close proximity to at least one gas opening 1904. That is, at least one gas opening 1902 and at least one gas opening 1904 are grouped together in a small area. Thus, at least one pair of reactive gas stream and inert gas stream is ejected onto a corresponding small area of the boundary layer to create depressions on or holes through the boundary layer, as illustrated in FIG. 20. As shown in FIG. 20, a stream 2002 of inert gas ejected from a gas opening 1904 of the gas nozzle structure 1804 creates a hole 2004 through a boundary layer 2006 of processing fluid, which exposes the wafer surface 102. Alternatively, the stream 2002 of inert gas may simply create a depression (not shown) on the boundary layer 2006, which reduces the thickness of the boundary layer at the depression. A stream 2008 of reactive gas ejected from a gas opening 1902 of the gas nozzle structure 1804 is applied directly to the exposed wafer surface through the created hole 2004 or to the created depression so that the reactive gas can diffuse through the boundary layer 2006 to reach the wafer surface 102. Since the stream 2002 of inert gas creates the hole or depression, the pressure of the stream 2008 of reactive gas can be reduced. Depending on the pressure, the stream 2008 of reactive gas may assist in creating the hole 2004 through or the depression on the boundary layer 2006.

The single-wafer spin-type processing unit 1806 of the apparatus 1800 can have a configuration similar to the single-wafer spin-type processing unit 106 of FIG. 1 or the single-wafer spin-type processing unit 702 of FIG. 7. That is, the single-wafer spin-type processing unit 1806 can include the fluid dispensing structure 146, which can be pivoted laterally across the semiconductor wafer W, or the fluid dispensing structure 704, which would be positioned over the gas nozzle structure 1804. Furthermore, the single-wafer spin-type processing unit 1806 may utilize a bar-type gas nozzle structure, similar to the bar-type gas nozzle structure 804 of FIGS. 8 and 9, a grid-type gas nozzle structure, similar to the grid-type gas nozzle structure 1004 of FIGS. 10 and 11, or a triangular gas nozzle structure, similar to the triangular gas nozzle structure 1404 of FIGS. 14 and 15. However, the gas nozzle structure for the single-wafer spin-type processing unit 1806 includes gas openings for ejecting streams of reactive gas and gas openings for ejecting streams of inert gas, as illustrated in FIG. 19 in reference to the gas nozzle structure 1804. Although the gas openings for inert gas and reactive gas may be grouped as shown in FIG. 19, the gas openings may simply be distributed randomly, similar to the openings 304 of the gas nozzle structure 104, shown in FIG. 3, where some of the gas openings are used to eject streams of reactive gas and some of the gas openings are used to eject streams of inert gas. The gas openings for reactive gas and the gas openings for inert gas can be located on the gas nozzle structure of the single-wafer spin-type processing unit 1806 in any arrangement.

In an alternative configuration, the single-wafer spin-type processing unit 1806 may utilize a gas nozzle structure 2102 having two elongated gas openings 2104 and 2106 on the bottom surface 2108 of the structure, as illustrated in FIG. 21. The elongated gas opening 2104 ejects a wall-like stream of reactive gas, while the elongated gas opening 2106 ejects a wall-like stream of inert gas. Thus, the wall-like stream of inert gas is used to create an elongated hole through or an elongated depression on a boundary layer of processing fluid, while the wall-like stream of reactive gas is used to apply the reactive gas directly to the exposed wafer surface or to the elongated depression so that the reactive gas can diffuse through the boundary layer. The gas nozzle structure 2102 may include additional elongated gas openings to eject wall-like streams of reactive gas or inert gas. Alternatively, one or more of the elongated gas openings of the gas nozzle structure 2102 may be replaced with one or more columns of small gas openings.

In another alternative configuration, the single-wafer spin-type processing unit 1806 may utilize a triangular gas nozzle structure 2202, which is a modified version of the gas nozzle structure 1404 of FIGS. 14 and 15, as shown in FIGS. 22 and 23. Similar to the gas nozzle structure 1404, the triangular gas nozzle structure 2202 includes the gas openings 1502 on the bottom surface 2204 of the structure for ejecting streams of reactive gas. However, the triangular gas nozzle structure 2202 further includes either a column 2206 of small gas openings 2208 for ejecting streams of inert gas, as illustrated in FIG. 22, or an elongated gas opening 2306 for ejecting a wall-like stream of inert gas, as illustrated in FIG. 23. The gas nozzle structure 2202 may include additional columns of small gas openings for ejecting streams of inert gas and/or additional elongated gas openings for ejecting wall-like streams of inert gas.

Although the various gas nozzle structures for the apparatuses 100 and 1800 have been described as being a single integrated structure, any of the described gas nozzle structures may be composed of two or more separate structures. As an example, the gas nozzle structure 2102 of FIG. 21 may be composed of one structure having the elongated gas opening 2104 and another structure having the elongated gas opening 2106. In addition, any of the described gas nozzle structures may be modified to include different types of gas openings. As an example, the bar-type gas nozzle structure 804 of FIGS. 8 and 9 may include one or more elongated gas openings.

Figure 24:
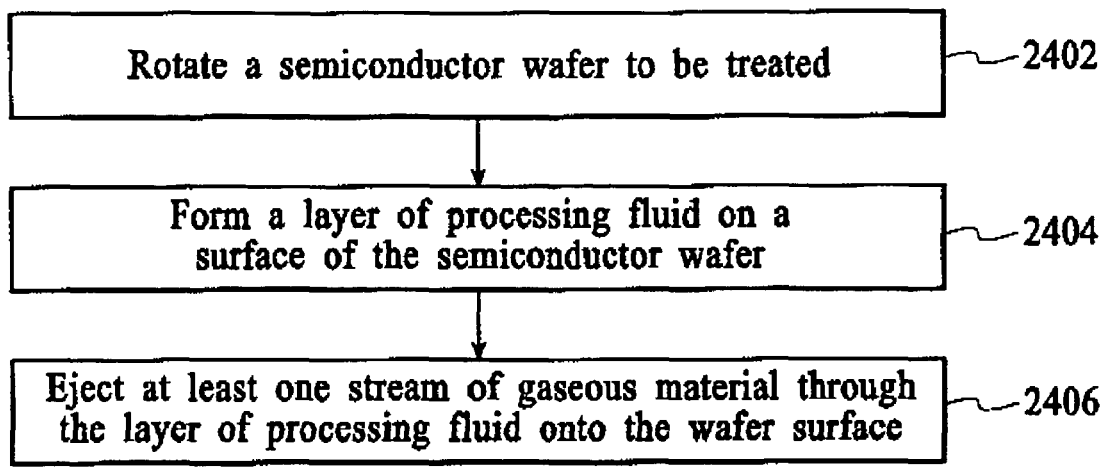
FIG. 24 is a process flow diagram of a method for treating a surface of a semiconductor wafer with a reactive gas in accordance with an embodiment of the invention.

A method for treating a surface of a semiconductor wafer with a reactive gas, such as ozone, in accordance with an embodiment of the invention is described with reference to the process flow diagram of FIG. 24. At step 2402, a semiconductor wafer to be treated is rotated. Next, at step 2404, a layer of processing fluid is formed on a surface of the semiconductor wafer. The processing fluid layer may be formed by dispensing the processing fluid in the form of a spray or fog. At step 2406, at least one stream of gaseous material is ejected through the layer of processing fluid onto the wafer surface to expose a portion of the wafer surface. In addition, the reactive gas is introduced to the exposed portion of the wafer surface to allow the reactive gas to react with the wafer surface. The reactive gas may be introduced as part of the stream of gaseous material. Alternatively, the reactive gas may be introduced as one or more separate streams of reactive gas. The reaction of the reactive gas with the wafer surface may form a layer of reacted material, e.g., an oxide layer, on the wafer surface, which may be used as a passivation layer, an interfacial layer or an oxide layer for any other purpose.

Figure 25:
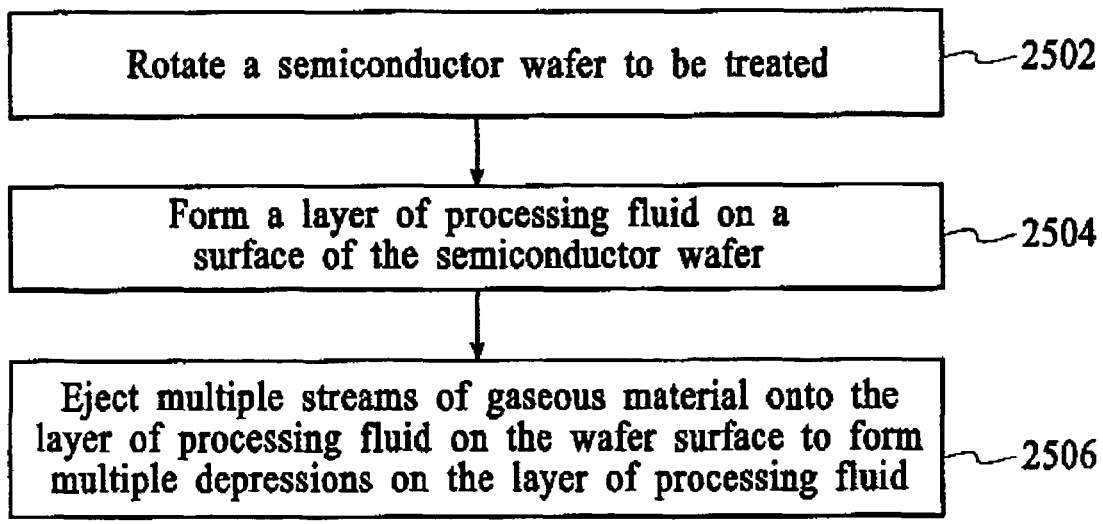
FIG. 25 is a process flow diagram of a method for treating a surface of a semiconductor wafer with a reactive gas in accordance with another embodiment of the invention.

A method for treating a surface of a semiconductor wafer with a reactive gas, such as ozone, in accordance with another embodiment of the invention is described with reference to the process flow diagram of FIG. 25. At step 2502, a semiconductor wafer to be treated is rotated. Next, at step 2504, a layer of processing fluid is formed on a surface of the semiconductor wafer. Again, the processing fluid layer may be formed by dispensing the processing fluid in the form of a spray or fog. At step 2506, multiple streams of gaseous material are ejected onto the layer of processing fluid to form multiple depressions on the layer of processing fluid. The depressions may be formed at separated and distinct locations on the layer of processing fluid. In addition, the reactive gas is introduced to the depressions to allow the reactive gas to reach and react with the wafer surface. Again, the reactive gas may be introduced as part of the streams of gaseous material. Alternatively, the reactive gas may be introduced as one or more separate streams of reactive gas. Again, the reaction of the reactive gas with the wafer surface may form a layer of reacted material, e.g., an oxide layer, on the wafer surface.

Figure 26:
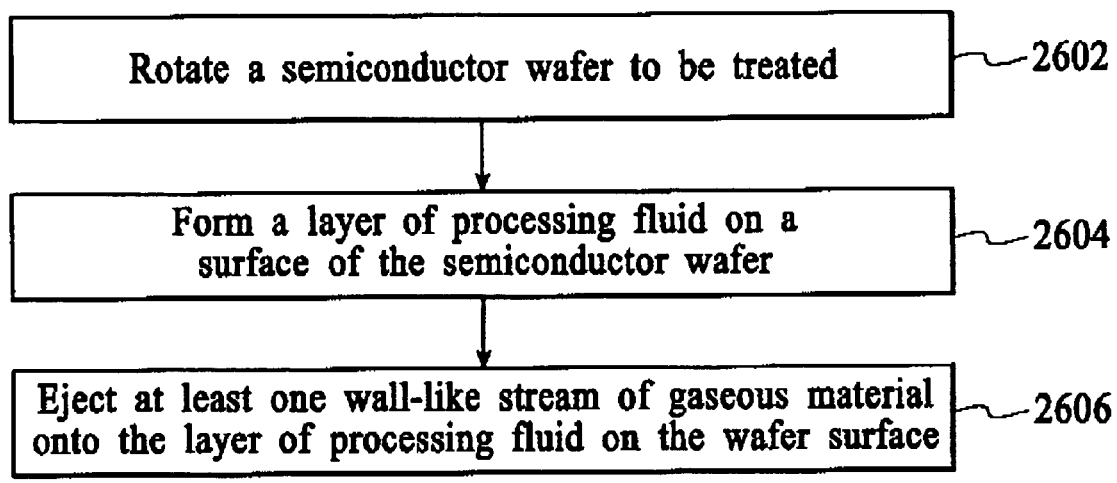
FIG. 26 is a process flow diagram of a method for treating a surface of a semiconductor wafer with a reactive gas in accordance with still another embodiment of the invention.

A method for treating a surface of a semiconductor wafer with a reactive gas, such as ozone, in accordance with still another embodiment of the invention is described with reference to the process flow diagram of FIG. 26. At step 2602, a semiconductor wafer to be treated is rotated. Next, at step 2604, a layer of processing fluid is formed on a surface of the semiconductor wafer. The processing fluid layer may be formed by dispensing the processing fluid in the form of a spray or fog. At step 2606, at least one wall-like stream of gaseous material is ejected onto the layer of processing fluid on the wafer surface, which may create a depression on the layer of processing fluid or a hole through the layer of processing fluid. In addition, the reactive gas is introduced to allow the reactive gas to reach and react with the wafer surface. The reactive gas may be introduced as part of the wall-like stream of gaseous material. Alternatively, the reactive gas may be introduced as one or more separate streams of reactive gas, which may include a wall-like stream of reactive gas. Again, the reaction of the reactive gas with the wafer surface may form a layer of reacted material, e.g., an oxide layer, on the wafer surface.

Although specific embodiments of the invention have been described and illustrated, the invention is not to be limited to the specific forms or arrangements of parts so described and illustrated. As an example, the invention may be used to clean and/or grow an oxide layer on an object other than a semiconductor wafer. In addition, the desired reaction may be a reaction other than oxidation using a gas other than ozone. The scope of the invention is to be defined by the claims appended hereto and their equivalents.

What is claimed is:

1. A method for treating a surface of an object with a reactive gas comprising:
    forming a processing fluid layer on said surface of said object; and
    ejecting at least one stream of reactive gas onto said processing fluid layer on said surface of said object to create a hole in said processing fluid layer so that stream of reactive gas directly contacts and reacts with said surface of said object, said reactive gas consisting of ozone gas.

2. The method of claim 1 further comprising forming a layer of reacted material on said surface of said object using said reactive gas.

3. The method of claim 2 wherein said forming of said layer of reacted material includes forming an oxide layer on said surface of said object using said reactive gas.

4. The method of claim 3 further comprising forming a layer of silicon-based material on said object such that said surface of said object includes said layer of silicon-based material, said oxide layer being formed over said layer of silicon-based material.

5. The method of claim 3 further comprising forming patterned structures on said object such that said surface of said object includes said patterned structures, said oxide layer being formed over said patterned structures.

6. The method of claim 3 further comprising forming an electrode region of a transistor in said object, said oxide layer being formed over said electrode region.

7. The method of claim 1 wherein said ejecting of said at least one stream of reactive gas includes ejecting a wall-like stream of said reactive gas onto said processing fluid layer on said surface of said object.

8. The method of claim 1 further comprising ejecting at least one stream of inert gas onto said processing fluid layer on said surface of said object.

9. The method of claim 8 wherein said at least one stream of inert gas is ejected at a higher pressure than said at least one stream of reactive gas.

10. The method of claim 1 wherein said forming of said processing fluid layer includes dispensing a processing fluid onto said surface of said object to form said processing fluid layer.

11. The method of claim 10 wherein said dispensing of said processing fluid includes dispensing said processing fluid in the form of a spray onto said surface of said object.

12. The method of claim 10 wherein said dispensing of said processing fluid includes dispensing said processing fluid in the form of a fog onto said surface of said object.

13. The method of claim 12 wherein said dispensing of said processing fluid includes generating said fog using sonic energy.

14. The method of claim 10 wherein said dispensing of said processing fluid includes passing said processing fluid through spaces of a gas nozzle structure, said gas nozzle structure being configured to eject said at least one stream of reactive gas onto said processing fluid layer.

15. The method of claim 1 wherein said ejecting of said at least one stream of reactive gas includes ejecting multiple streams of reactive gas from a plurality of openings of a gas nozzle structure.

16. The method of claim 15 wherein said gas nozzle structure is shaped in a bar-like configuration, and wherein said ejecting of said multiple streams of reactive gas from said plurality of openings of said gas nozzle structure includes ejecting said multiple streams of reactive gas onto an area of said processing fluid layer that corresponds to said bar-like configuration of said gas nozzle structure.

17. The method of claim 15 wherein said gas nozzle structure includes a grid-like portion with a plurality of spaces, said spaces of said grid-like portion allowing said processing fluid dispensed to pass through said gas nozzle structure.

18. The method of claim 15 wherein said gas nozzle structure is shaped in a triangular configuration.

19. A method for treating a surface of an object with a reactive gas comprising:
    forming a processing fluid layer on said surface of said object; and
    ejecting multiple streams of gaseous material onto said processing fluid layer on said surface of said object such that multiple holes are formed in said processing fluid layer, including introducing said reactive gas through said multiple holes to allow said reactive gas to direct contact and react with said surface of said object, said reactive gas consisting of ozone gas.

20. The method of claim 19 wherein said ejecting of said multiple streams of gaseous material includes controlling pressure of said multiple streams of gaseous material.

21. The method of claim 19 wherein said gaseous material includes said reactive gas.

22. The method of claim 19 wherein said introducing of said reactive gas includes forming a layer of reacted material on said surface of said object.

23. The method of claim 22 wherein said forming of said layer of reacted material includes forming an oxide layer on said surface of said object.

24. The method of claim 23 further comprising forming a layer of silicon-based material on said object such that said surface at said object includes said layer of silicon-based material, said oxide layer being formed over said layer of silicon-based material.

25. The method of claim 23 further comprising forming patterned structures on said object such that said surface of said object includes said patterned structures, said oxide layer being formed over said patterned structures.

26. The method of claim 23 further comprising forming an electrode region of a transistor in said object, said oxide layer being formed over said electrode region.

27. The method of claim 19 wherein said ejecting of said multiple streams of gaseous material includes ejecting a wall-like stream of gaseous material onto said processing fluid layer.

28. The method of claim 19 wherein said ejecting of said multiple streams of gaseous material includes ejecting at least one stream of inert gas and at least one stream of reactive gas.

29. The method of claim 28 wherein said at least one stream of inert gas is ejected at a higher pressure than said at least one stream of reactive gas.

30. The method of claim 19 wherein said forming of said processing fluid layer includes dispensing a processing fluid onto said surface of said object to form said processing fluid layer.

31. The method of claim 30 wherein said dispensing of said processing fluid includes dispensing said processing fluid in the form of a spray onto said surface of said object.

32. The method of claim 30 wherein said dispensing of said processing fluid includes dispensing said processing fluid in the form of a fog onto said surface of said object.

33. The method of claim 32 wherein said dispensing of said processing fluid includes generating said fog using sonic energy.

34. The method of claim 30 wherein said dispensing of said processing fluid includes passing said processing fluid through spaces of a gas nozzle structure, said gas nozzle structure being configured to eject said multiple streams of gaseous material onto said processing fluid layer.

35. The method of claim 19 wherein said ejecting of said multiple streams of gaseous material includes ejecting said multiple streams of gaseous material from a plurality of openings of a gas nozzle structure.

36. The method of claim 35 wherein said gas nozzle structure is shaped in a bar-like configuration, and wherein said ejecting of said multiple streams of gaseous material from said plurality of openings of said gas nozzle structure includes ejecting said multiple streams of gaseous material onto an area of said fluid layer that corresponds to said bar-like configuration of said gas nozzle structure.

37. The method of claim 35 wherein said gas nozzle structure includes a grid-like portion wit a plurality of spaces, said spaces of said grid-like portion allowing said processing fluid dispensed to pass through said gas nozzle structure.

38. The method of claim 35 wherein said gas nozzle structure is shaped in a triangular configuration.

39. A method for treating a surface of an object with a reactive gas comprising:
    forming a processing fluid layer on said surface of said object;
    ejecting at least one stream of inert gas onto said processing fluid layer on said surface of said object to create a hole in said processing fluid layer; and
    ejecting at least one stream of reactive gas into said holes to allow said reactive gas to directly contact and react with said surface of said object.

40. The method of claim 39 wherein said at least one stream of inert gas is ejected at a higher pressure than said at least one stream of reactive gas.

41. The method of claim 39 wherein said ejecting of said at least one stream of inert gas includes controlling pressure of said at least one stream of inert gas.

42. The method of claim 39 further comprising forming a layer of reacted material on said surface of said object using said reactive gas.

43. The method of claim 42 wherein said reactive gas includes ozone, and wherein said forming of said layer of reacted material includes forming an oxide layer on said surface of said object using said reactive gas.

44. The method of claim 43 further comprising forming a layer of silicon-based material on said object such that said surface of said object includes said layer of silicon-based material, said oxide layer being formed over said layer of silicon-based material.

45. The method of claim 39 wherein said ejecting of said at least one stream of inert gas includes ejecting a wall-like stream of inert gas onto said fluid layer on said surface of said object.

46. The method of claim 39 wherein said ejecting of said at least one stream of reactive gas includes ejecting a wall-like stream of reactive gas onto said fluid layer on said surface of said object.

47. The method of claim 39 wherein said forming of said processing fluid layer includes dispensing a processing fluid onto said surface of said object to form said processing fluid layer.

48. The method of claim 47 wherein said dispensing of said processing fluid includes dispensing said processing fluid in the form of a spray onto said surface of said object.

49. The method of claim 47 wherein said dispensing of said processing fluid includes passing said processing fluid trough spaces of a gas nozzle structure, said gas nozzle structure being configured to eject said at least one stream of reactive gas onto said processing fluid layer.

50. The method of claim 39 wherein said ejecting of said at least one stream of reactive gas includes ejecting multiple streams of reactive gas from a plurality of openings of a gas nozzle structure.

51. A method for treating a surface of an object with a reactive gas comprising:
    forming a processing fluid layer on said surface of said object; and
    ejecting at least one stream of reactive gas onto said processing fluid layer on said surface of said object to create a hole in said processing fluid layer so that said reactive gas directly contacts and reacts with said surface of said object, said reactive gas consisting of ozone gas and at least one other gas selected from a group consisting of nitrogen gas, HF vaporized gas and IPA vaporized gas.

52. The method of claim 51 further comprising forming a layer of reacted material on said surface of said object using said reactive gas.

53. The method of claim 52 wherein said forming of said layer of reacted material includes forming an oxide layer on said surface of said object using said reactive gas.

54. The method of claim 51 wherein said ejecting of said at least one stream of reactive gas includes ejecting a wall-like stream of said reactive gas said processing fluid layer on said surface of said object.

55. The method of claim 51 further comprising ejecting at least one stream of inert gas onto said processing fluid layer on said surface of said object.

56. The method of claim 55 wherein said at least one stream of inert gas is ejected at a higher pressure than said at least one stream of reactive gas.

57. The method of claim 51 wherein said ejecting of said at least one stream of reactive gas includes controlling pressure of said at least one stream of reactive gas.

* * * * *